(12) United States Patent
Igaue et al.

(10) Patent No.: US 10,121,541 B2
(45) Date of Patent: Nov. 6, 2018

(54) SEMICONDUCTOR DEVICE AND INFORMATION PROCESSING SYSTEM

(71) Applicant: RENESAS ELECTRONICS CORPORATION, Tokyo (JP)

(72) Inventors: Futoshi Igaue, Tokyo (JP); Kenji Yoshinaga, Tokyo (JP); Naoya Watanabe, Tokyo (JP); Mihoko Akiyama, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 142 days.

(21) Appl. No.: 15/228,631

(22) Filed: Aug. 4, 2016

(65) Prior Publication Data
US 2017/0060438 A1 Mar. 2, 2017

(30) Foreign Application Priority Data

Sep. 1, 2015 (JP) .................................. 2015-171808

(51) Int. Cl.
*G06F 12/00* (2006.01)
*G11C 15/04* (2006.01)

(52) U.S. Cl.
CPC .................. *G11C 15/04* (2013.01)

(58) Field of Classification Search
CPC .................................................. G11C 15/04
See application file for complete search history.

(56) References Cited

U.S. PATENT DOCUMENTS

| | | | | |
|---|---|---|---|---|
| 5,854,760 A * | 12/1998 | Ikenaga | ............. | G06F 15/8023 365/49.11 |
| 7,272,685 B2 | 9/2007 | Inoue | | |
| 2004/0174764 A1* | 9/2004 | Matsuoka | ............. | G11C 15/00 365/226 |
| 2010/0293347 A1* | 11/2010 | Luttrell | ................. | G06F 9/3851 711/156 |
| 2010/0332790 A1* | 12/2010 | Maruyama | .......... | G06F 12/1027 711/207 |

(Continued)

FOREIGN PATENT DOCUMENTS

JP 2005-018942 A 1/2005

*Primary Examiner* — Prasith Thammavong
(74) *Attorney, Agent, or Firm* — McDermott Will & Emery LLP

(57) ABSTRACT

The present invention makes it possible to form a circuit configuration that is capable of executing a keyword search at an increased speed while suppressing an increase in the memory capacity of a content-addressable memory. A semiconductor device according to an aspect of the present invention searches an input data string for a predesignated keyword, and includes a first content-addressable memory that stores a partial keyword corresponding to a predetermined number of data beginning with the first data of the keyword, a second content-addressable memory that stores the entirety of the keyword, and a control circuit that is coupled to the first content-addressable memory and to the second content-addressable memory. When a portion matching the partial keyword is detected in the input data string by a search in the first content-addressable memory, the second content-addressable memory executes a search on search data extracted from the input data string.

16 Claims, 22 Drawing Sheets

(56) References Cited

U.S. PATENT DOCUMENTS

| | | | |
|---|---|---|---|
| 2014/0068173 A1* | 3/2014 | Cooke | G11C 15/00 711/108 |
| 2014/0281116 A1* | 9/2014 | Abdallah | G06F 12/1054 711/3 |
| 2017/0153835 A1* | 6/2017 | Miki | G06F 3/0625 |

* cited by examiner

FIG. 21
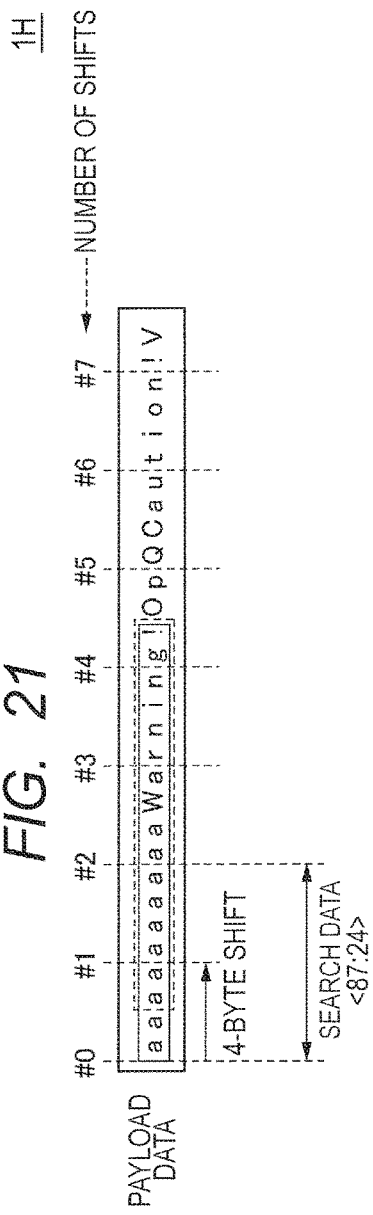
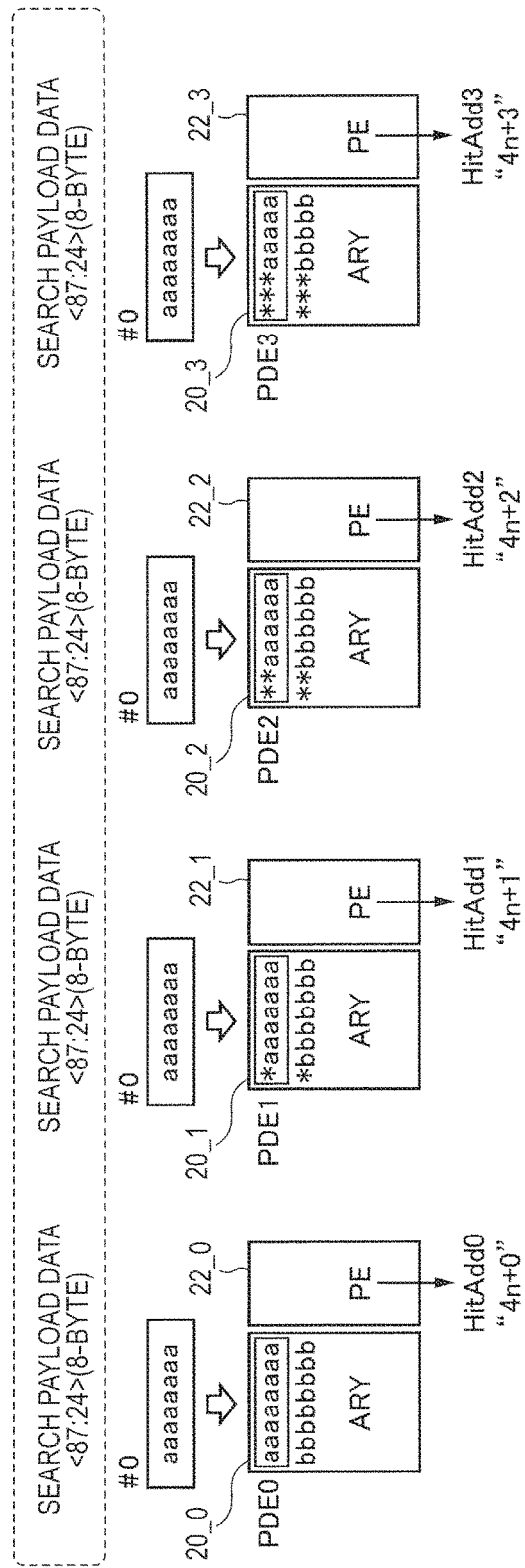

SEMICONDUCTOR DEVICE AND INFORMATION PROCESSING SYSTEM

CROSS-REFERENCE TO RELATED APPLICATIONS

The disclosure of Japanese Patent Application No. 2015-171808 filed on Sep. 1, 2015 including the specification, drawings, and abstract is incorporated herein by reference in its entirety.

BACKGROUND

The present invention relates to a semiconductor device that searches an input data string for a predesignated keyword, and also relates to an information processing system that includes the semiconductor device.

As information and communications technology rapidly progresses, there is an increasing need for executing a rapid search for a specific keyword included in data. In the field of security, for example, it is demanded that a character string be extracted at the wire speed of a network.

In an approach that uses a tree search algorithm or a byte shift search algorithm, the need for such a high-speed keyword search is supplied by using a CPU (Central Processing Unit) formed of a plurality of chips or a high-speed CPU. Additionally, in place of such implementation based on software, the use of a semiconductor device including a content-addressable memory (hereinafter may be referred to as the "CAM") is proposed for implementation.

Disclosed, for instance, in Japanese Unexamined Patent Application Publication No. 2005-018942 is an integrated circuit having a content-addressable memory function that is capable of reducing the load imposed on a control section. Using such an integrated circuit makes it possible to execute a keyword search at an increased speed.

SUMMARY

The integrated circuit having a content-addressable memory function disclosed in Japanese Unexamined Patent Application Publication No. 2005-018942 performs a search operation by shifting one byte at a time. A method of achieving an increased search throughput during the use of such a configuration is to increase the number of bytes to be shifted. However, an increase in the number of bytes to be shifted makes it necessary to increase the memory capacity of the content-addressable memory in accordance with the increase in the number of bytes. Such an increase in the memory capacity of the content-addressable memory will increase not only the cost of manufacturing but also the footprint of the integrated circuit and the power consumption.

That is to say, search throughput, manufacturing cost, footprint, and power consumption are in a trade-off relationship. It is therefore demanded that a circuit configuration capable of executing a keyword search at an increased speed be formed while suppressing an increase in the memory capacity of a content-addressable memory.

Other problems and novel features will become apparent from the following description and from the accompanying drawings.

According to an aspect of the present invention, there is provided a semiconductor device that searches an input data string for a predesignated keyword. The semiconductor device includes a first content-addressable memory, a second content-addressable memory, and a control circuit. The first content-addressable memory stores a partial keyword that corresponds to a predetermined number of data beginning with the first data of the keyword. The second content-addressable memory stores the entirety of the keyword. The control circuit is coupled to the first content-addressable memory and to the second content-addressable memory. When a portion matching the partial keyword is detected in the input data string by a search in the first content-addressable memory, the second content-addressable memory searches for search data extracted from the input data string.

The aspect of the present invention makes it possible to form a circuit configuration that is capable of executing a keyword search at an increased speed while suppressing an increase in the memory capacity of a content-addressable memory.

BRIEF DESCRIPTION OF THE DRAWINGS

FIG. 21 is a schematic diagram illustrating a configuration of essential parts of the semiconductor device according to a ninth embodiment of the present invention and a search operation performed by the same semiconductor device.

DETAILED DESCRIPTION

Figure 1:
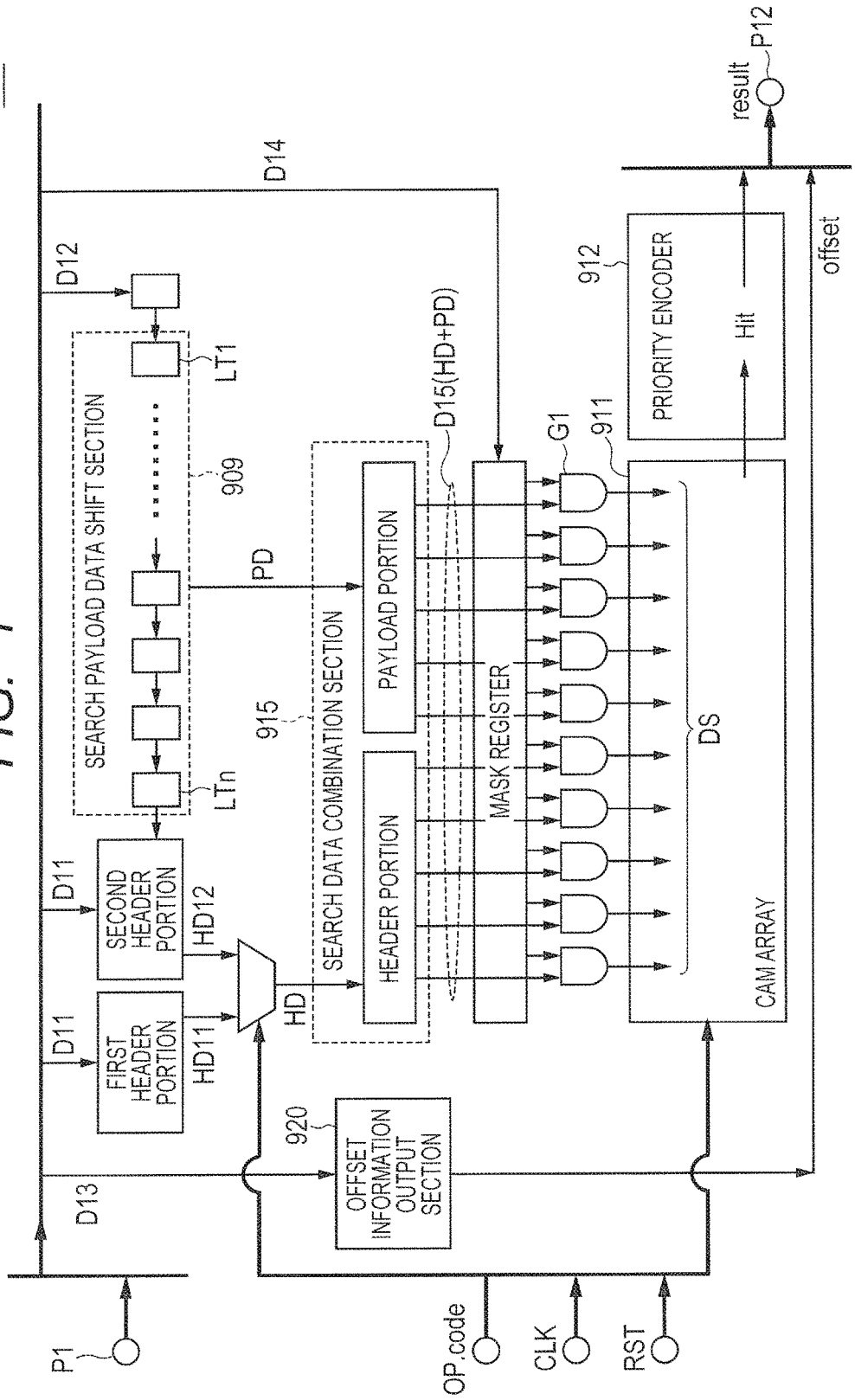
FIG. 1 is a block diagram illustrating a configuration of an integrated circuit having a built-in CAM, that is, an integrated circuit having a content-addressable memory function according to a related art of the present invention.

Embodiments of the present invention will now be described with reference to the accompanying drawings. Elements that are depicted in the drawings and identical or equivalent to each other are designated by the same reference numerals and will not be redundantly described.

[A. Related Art]

A search operation of an integrated circuit having a content-addressable memory function described in Japanese Unexamined Patent Application Publication No. 2005-018942 will be described below in order to clarify the technical meaning of a semiconductor device according to an embodiment of the present invention.

FIG. 1 is a block diagram illustrating a configuration of an integrated circuit having a built-in CAM, that is, an integrated circuit having a content-addressable memory function according to a related art of the present invention. Referring to FIG. 1, the integrated circuit having a built-in CAM 900 executes a signature matching search to search payload data for a designated character string. In particular, the integrated circuit having a built-in CAM 900 includes, as main components, a search payload data shift section 909, an offset information output section 920, a search data combination section 915, and a CAM array 911.

The search payload data shift section 909 includes n latch sections LT1-LTn (n≥2). Each latch section is capable of storing 1-byte latch data. The offset information output section 920 stores information about the start position of a character string to search for in payload data. The CAM array 911 stores the payload data and the character string to search for in a header portion.

The search payload data shift section 909 outputs search payload data PD by shifting the payload data D12 one byte (equivalent to one character) at a time. The search data combination section 915 generates search data D15 by combining header data HD with the search payload data PD, which is successively updated by shifting. The search data D15 is compared against an entry value. The entry value is a character string to search for that is stored in a search table of the CAM array 911. If it is determined that the search payload data PD in the search data D15 matches the entry value, the offset information output section 920 outputs an offset information indicative of the start position of the search payload data PD. If the entire search data D15 (header data HD and search payload data PD) matches an entry value stored in the CAM array 911, the offset information output section 920 outputs a match (hit) and the address information about a matching entry.

Figure 2:
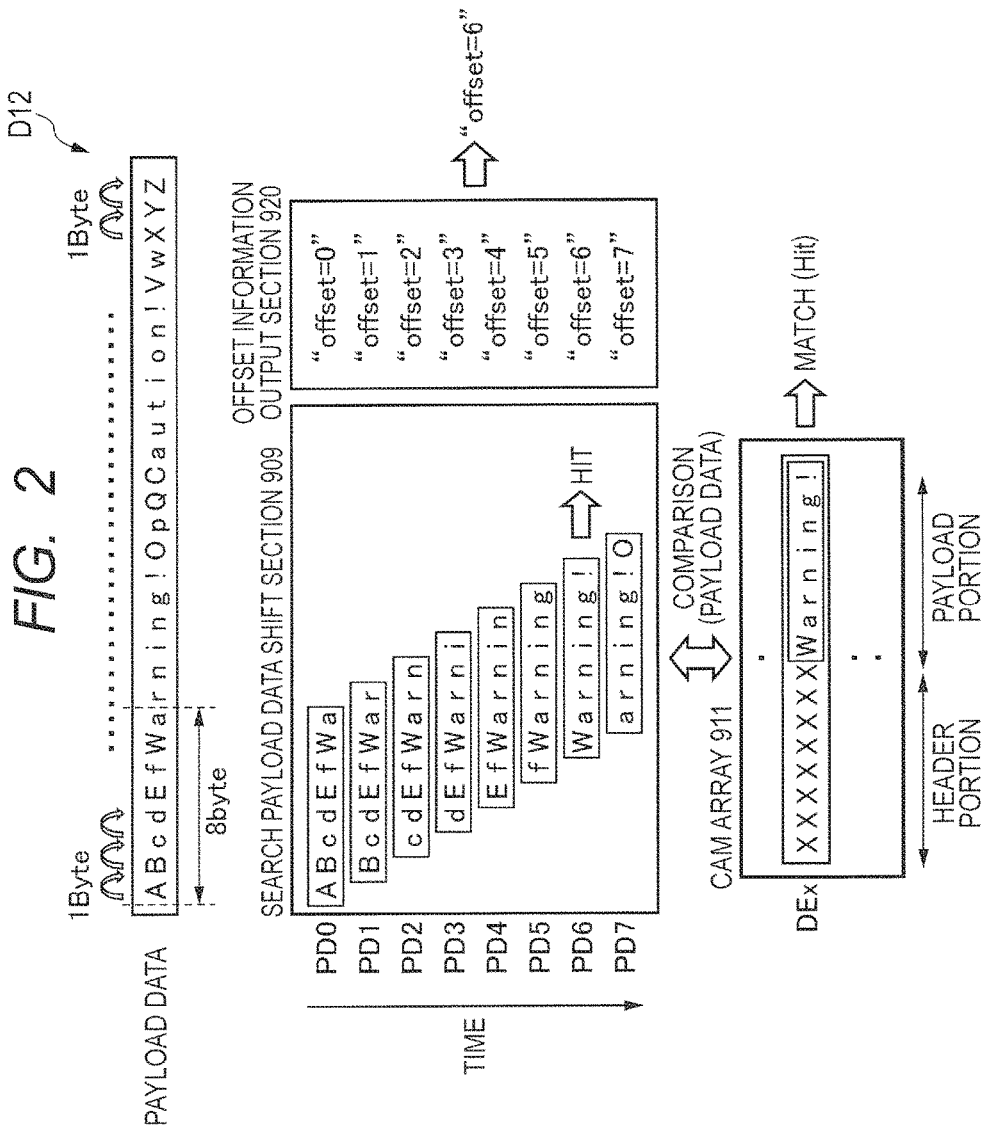
FIG. 2 is a schematic diagram illustrating a search operation that is performed on payload data by using the integrated circuit having a built-in CAM illustrated in FIG. 1.

FIG. 2 is a schematic diagram illustrating a search operation that is performed on payload data by using the integrated circuit having a built-in CAM illustrated in FIG. 1. Referring to FIG. 2, in the search payload data shift section 909, the payload data D12 "ABcdEfWa . . . " is shifted one byte (equivalent to one character) at a time beginning with the first eight characters "ABcdEfWa". The shifted payload data D12 is compared against an entry value that is a character string stored in the CAM array 911 and targeted for a search. FIG. 2 indicates that the character string "Warning!" is stored in a payload portion of an entry DEx in the CAM array 911. In other words, FIG. 2 illustrates an example in which a search is executed to determine the position in the payload data D12 (offset information) at which the character string "Warning!" begins.

Search payload data PD0-PD7 are sequentially extracted over time from the payload data D12. That is to say, the extracted search payload data changes, for example, from PD0 "ABcdEfWa" (when offset=0) through PD1 "BcdEfWar" (when offset=1) to PD2 "cdEfWarn" (when offset=2), If, in the above instance, the character string "XXXXXXXXWarning!" is stored in an entry DEx in the CAM array 911 and when offset=6, the search payload data PD6="Warning!" is combined in the search data combination section 915 and matches the search data D15 "XXXXXXXXWarning!". It is presumed that the header portion "XXXXXXXX" of the entry DEx in the CAM array 911 matches header data HD.

The CAM array 911 then outputs a match (hit) to a priority encoder 912 as a result. Upon receipt of the result, that is, a match (hit), the priority encoder 912 outputs address information about an address in the CAM array 911 at which "Warning!" is stored. Additionally, the priority encoder 912 also outputs offset information "offset=6", which is a shift value indicative of a position in the payload data D12 at which "Warning!" begins.

In the search operation illustrated in FIG. 2, the search payload data PD is sequentially outputted by allowing the search payload data shift section 909 to shift the payload data D12 one byte at a time. By contrast, a case where an increased number of bytes of the payload data D12 are shifted to achieve an increased search throughput will be discussed.

Figure 3:
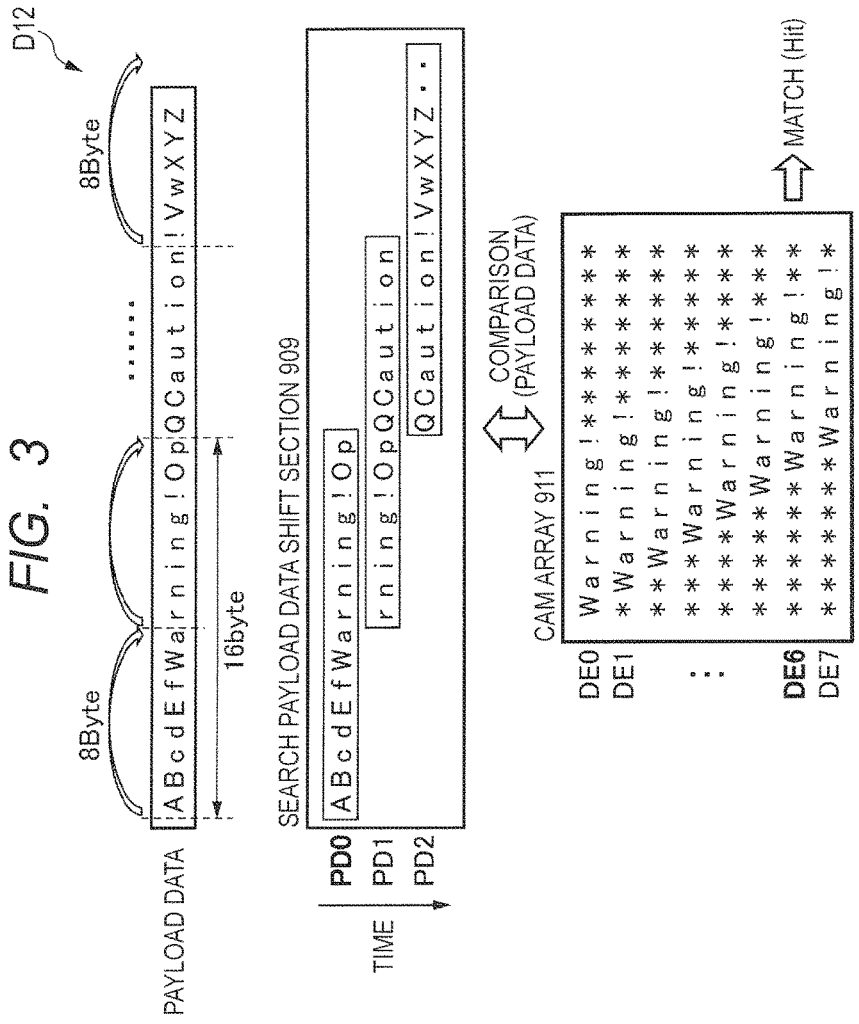
FIG. 3 is a schematic diagram illustrating a search operation that is performed on payload data by using the integrated circuit having a built-in CAM illustrated in FIG. 1 in such a manner as to increase the search throughput 8-fold.

FIG. 3 is a schematic diagram illustrating a search operation that is performed on payload data by using the integrated circuit having a built-in CAM illustrated in FIG. 1 in such a manner as to increase the search throughput 8-fold. In the search operation illustrated in FIG. 3, the search throughput is increased 8-fold by increasing the number of shift bytes of payload data D12 to 8 bytes.

Referring to FIG. 3, the search payload data shift section 909 acquires 16 bytes of payload data D12 and outputs the search payload data PD by shifting eight bytes at a time. Before the search payload data PD is searched for the character string "Warning!", the CAM array 911 stores entries the number of which is adequate for the bytes to be shifted. An asterisk "*" in an entry in the CAM array 911 shown in FIG. 3 represents a setting (don't care) that is regarded as a match irrespective of the value of payload data to be compared in a search operation.

In the example of FIG. 3, the search payload data PD0 "ABcdEfWarning!Op" is compared against each of entries DE0-DE7 in the CAM array 911. The search payload data PD0 is determined to match the entry DE6 "****Warning!" in the CAM array 911. As described above, eight entries are required to search for one character string.

In other words, while only one entry is required as a search table for a search in which one byte is shifted at a time as indicated in FIG. 2, eight entries are required as a search table for a search in which eight bytes are shifted at a time as indicated in FIG. 3. In short, when the search throughput is increased by switching to an 8-byte shift, the number of required entries is increased 8-fold, that is, an 8-fold memory capacity is required, as compared to a 1-byte shift.

As discussed above, the integrated circuit having a content-addressable memory function described in Japanese Unexamined Patent Application Publication No. 2005-018942 executes a search by shifting the payload data one byte at a time. This makes it difficult to increase the overall search throughput of a system. Meanwhile, if the payload data is shifted an increased number of bytes in order to increase the search throughput, the memory capacity required for storing the character string to search for increases in proportion to the number of bytes to be shifted. This causes a problem in which the footprint and power consumption are increased.

In view of the above circumstances, the semiconductor device according to an embodiment of the present invention and an information processing system including the semiconductor device are provided to form a circuit configuration that solves a trade-off between an increase in the search throughput and an increase in the manufacturing cost, footprint, and power consumption in order to increase the search throughput while suppressing an increase in the memory capacity.

[B. System Configuration]

Figure 4:
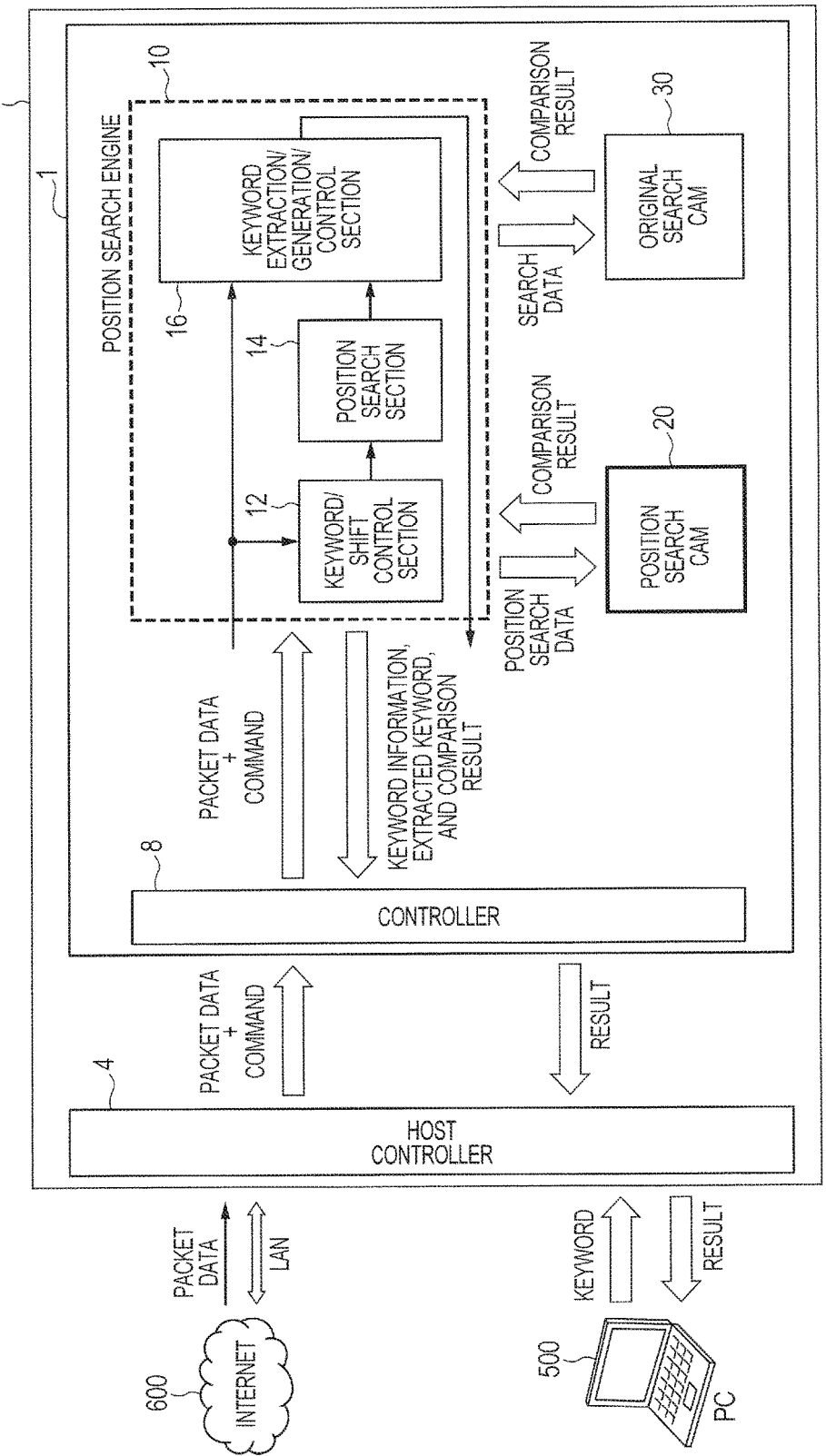
FIG. 4 is a schematic diagram that functionally illustrates essential parts of an information processing system including a semiconductor device according to an embodiment of the present invention.

First of all, an overall configuration of the information system including the semiconductor device according to an embodiment of the present invention will be outlined. FIG. 4 is a schematic diagram that functionally illustrates essential parts of the information processing system 2 including the semiconductor device according to an embodiment of the present invention.

The information processing system 2 according to an embodiment of the present invention searches an input data string for a keyword. Any data string can be handled as the input data string depending on the application of the information processing system 2. The information processing system 2 is applicable, for example, to a network search engine, a network security system, a system detecting a specific pattern (for example, a virus pattern or a user-designated pattern) in payload data within packet data, or a system searching for data matching a specific pattern whose location in big data is unknown. When the information processing system 2 is disposed in a network, for example, packet data conveyed through the network is conceivable as the input data string.

In this document, the term "keyword" includes a search rule that is used to identify data to be extracted from the input data string. The keyword may be one or more sets of specific data (for example, a character string or a data pattern) or may specify the type of data to be matched such as a regular expression. Typically, the keyword is a user-designated character string. A general application example in which the input data string and the keyword are both character strings will be described below.

FIG. 4 illustrates a configuration in which the information processing system 2 is disposed in a network. When a user operates a personal computer 500 to enter a desired keyword, the entered keyword is registered in the information processing system 2. The information processing system 2 then uses the registered keyword to execute a keyword search on packet data flowing from the Internet 600 coupled, for example, through a LAN (Local Area Network). The information processing system 2 outputs the result of the keyword search (for example, the presence of a match for the keyword, information about packet data matching the keyword, and the start position of a matching keyword in packet data) to the personal computer 500.

Referring to FIG. 4, the information processing system 2 includes, as main components, a semiconductor device 1 and a host controller 4.

Upon receipt of packet data and a command from the host controller 4, the semiconductor device 1 executes the aforementioned keyword search and outputs the result of the keyword search to the host controller 4. In particular, the semiconductor device 1 includes a controller 8, a position search engine 10, a position search CAM 20, and an original search CAM 30.

The controller 8 outputs the packet data and command, which is received from the host controller 4, to the position search engine 10, and receives the result (for example, keyword information, an extracted keyword, and a comparison result) from the position search engine 10. The controller 8 outputs the result from the position search engine 10 to the host controller 4.

In the semiconductor device 1 according to an embodiment of the present invention, the position search CAM 20 executes a position search (partial search) on the input data string by using a part of a designated keyword, and the original search CAM 30 executes an original search (full-text search) on the basis of the result of the position search by the position search CAM 20 in order to check for a match for the entirety of the designated keyword. The position search CAM 20 is a content-addressable memory for storing a partial keyword that corresponds to a portion formed of a predetermined number of data from the beginning of the entered keyword. The original search CAM 30 is a content-addressable memory for storing the entirety of the entered keyword.

As described above, the semiconductor device 1 executes the position search, which is a partial search on the input data string, and the original search, which is a full-text search, in combination with each other. This enables the semiconductor device 1 to execute a more efficient search while reducing the overall memory capacity of circuitry.

The position search engine 10 is an example of a control circuit and coupled to the position search CAM 20 and the original search CAM 30. The position search engine 10 inputs position search data, which is used for a position search, to the position search CAM 20 and receives a comparison result (for example, the start position of the partial keyword in the input data string) from the position search CAM 20. The position search engine 10 then extracts search data, which is used for an original search, in accordance with the comparison result from the position search CAM 20, and inputs the extracted search data to the original search CAM 30. Finally, the position search engine 10 receives a comparison result (for example, the start position of a keyword in the input data string) from the original search CAM 30.

As described above, when a portion matching the partial keyword is detected in the input data string as a result of a search in the position search CAM 20, the position search engine 10, which is an example of the control circuit, extracts search data from the input data string in accordance with position information about the detected portion matching the partial keyword, and inputs the extracted search data to the original search CAM 30.

A keyword containing "* (asterisk)" (don't care) may be registered in the position search CAM 20 and the original search CAM 30. "*" is constantly determined to be a match (hit) irrespective of the value of a comparison target. It is therefore preferred that a ternary CAM be used as the position search CAM 20 and as the original search CAM 30 instead of a binary CAM. However, if "*" can be registered as a keyword, a content-addressable memory of any type may be employed. Meanwhile, a keyword used with the semiconductor device 1 according to a later-described tenth embodiment does not need to contain "*". Therefore, a binary CAM may be used to configure the semiconductor device 1 according to the tenth embodiment.

The position search engine 10 includes a keyword shift/control section 12, a position search section 14, and a keyword extraction/generation/control section 16. The keyword shift/control section 12 shifts the input data string a predetermined number of data at a time and outputs the resultant input data string as data (position search data) to search for in the position search CAM 20. The keyword shift/control section 12 exercises control over the input of position search data to the position search CAM 20 and the reception of a comparison result from the position search CAM 20.

The position search section 14 identifies, for example, the start position of a keyword in the input data string in accordance with the comparison result from the position search CAM 20.

In accordance, for instance, with information about the identified start position of a keyword, which is identified by the position search section 14, the keyword extraction/generation/control section 16 generates search data to be inputted to the original search CM 30, and receives a comparison result from the original search CAM 30.

The host controller 4 provides overall control of the information processing system 2 including the semiconductor device 1. Typically, the host controller 4 receives a keyword inputted from the outside and outputs a search result obtained from the original search CAM 30 to the outside.

FIG. 4 functionally illustrates main components of the information processing system 2 according to an embodiment of the present invention. FIG. 4 does not specifically limit the implementation of the information processing system 2. That is to say, a desired implementation technology available to embody the present invention may be employed as far as the position search CAM 20 and the original search CAM 30 are implemented by using a content-addressable memory. Further, any design may be employed as regards a portion to be incorporated into a single integrated circuit (chip).

For example, FIG. 4 schematically illustrates an example in which the controller 8, the position search engine 10, the position search CAM 20, and the original search CAM 30 are implemented in the single semiconductor device 1. However, the present invention is not limited to such a configuration. Alternatively, some of the aforementioned components may be formed in a separate integrated circuit. Another alternative is to incorporate an additional function (not shown) into the semiconductor device 1.

Moreover, the host controller 4 and the controller 8, for example, need not always be implemented in an integrated circuit. Necessary functions may be implemented by allowing a processor to execute a program. As an example, the host controller 4 may be implemented, for instance, by using an NPU (Network Processing Unit), an ASIC (Application Specific Integrated Circuit), or an FPGA (Field-Programmable Gate Array).

[C. First Embodiment]

Figure 5:
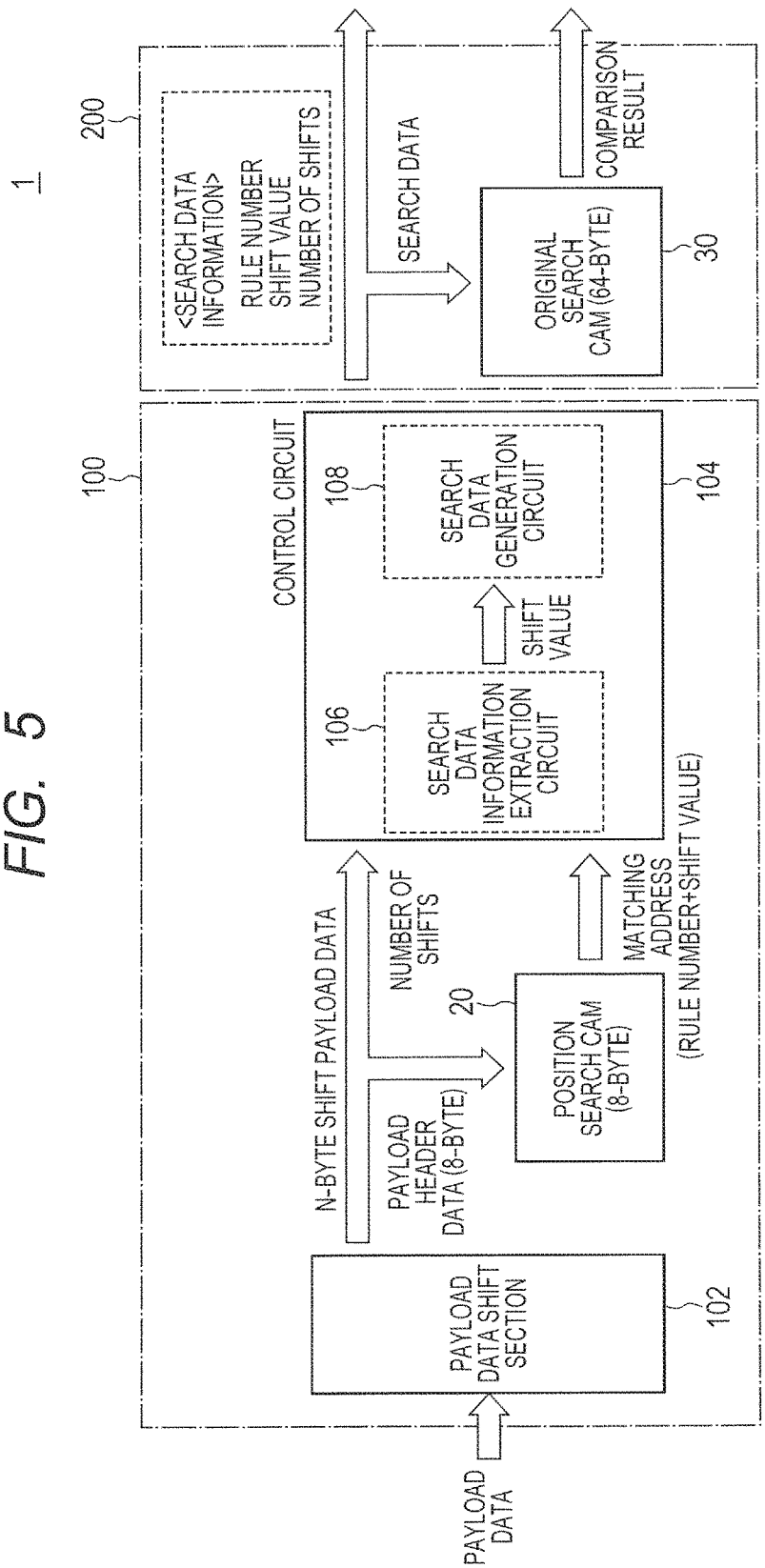
FIG. 5 is a schematic diagram illustrating a configuration of essential parts of the semiconductor device according to a first embodiment of the present invention.
Figure 6:
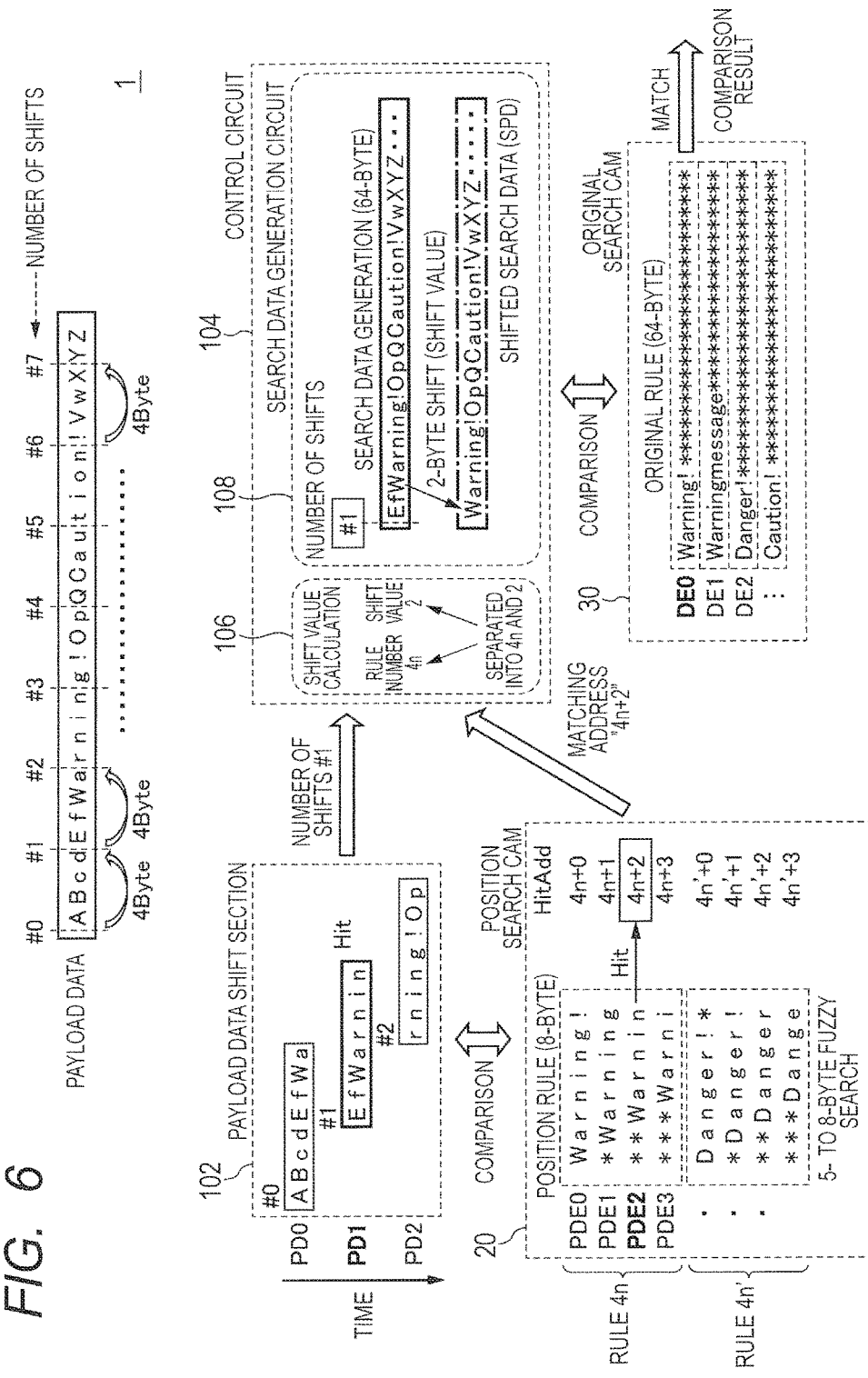
FIG. 6 is a schematic diagram illustrating a search operation that is performed on payload data by using the semiconductor device shown in FIG. 3.

The semiconductor device 1 according to a first embodiment of the present invention will now be described. FIG. 5 is a schematic diagram illustrating a configuration of essential parts of the semiconductor device 1 according to the first embodiment. FIG. 6 is a schematic diagram illustrating a search operation that is performed on payload data by using the semiconductor device shown in FIG. 5.

In the first and subsequent embodiments, it is assumed that payload data is used an example of the input data string. The semiconductor device 1 according to the first embodiment searches the payload data for a designated character string (hereinafter may be referred to as a "search character string") as an example of a predesignated keyword. The semiconductor device 1 implements a more efficient search with a reduced memory capacity by executing a position search, which is a partial search, on the payload data and by executing an original search, which is a full-text search, on the payload data.

In particular, referring to FIG. 5, the semiconductor device 1 includes a position search section 100 and an original search section 200. The position search section 100 executes a position search (partial search). The original search section 200 executes an original search (full-text search).

The position search section 100 includes, as main components, a payload data shift section 102, a control circuit 104, and a position search CAM 20. The control circuit 104 includes a search data information extraction circuit 106 and a search data generation circuit 108. The original search section 200 includes, as a main component, an original search CAM 30. The position search CAM 20 and the original search CAM 30 can be implemented by a general-purpose CAM array (search memory).

The position search section 100 detects start position information about a character string to search for, that is, a search character string in inputted payload data, and generates, in accordance with the detected start position information, search data to be subjected to a full-text search in the original search section 200. The position search CAM 20 stores, as an entry, a part of the search character string required for a position search (partial search). More specifically, the position search CAM 20 stores a part of the search character string that corresponds to a predetermined number of data from the beginning of the search character string. Meanwhile, the original search CAM 30 stores the entirety of the search character string.

The payload data shift section 102 shifts the payload data a predetermined number of data (typically a predetermined number of bytes) at a time and outputs the resultant payload data as data to search for in the position search CAM 20 (as the search payload data PD). More specifically, the payload data shift section 102 outputs, as the search payload data PD, data following the predetermined number of bytes from the beginning of the payload data.

In the first embodiment, a search character string is used as a keyword. Thus, the payload data shift section 102 shifts the payload data a number of data (for example, 4 bytes) at a time. The number of data is equivalent to an integer multiple of the number of data (1 byte=8 bits) required for the definition of one character. As the payload data is determined in this manner, a match for the keyword can be checked for in a form appropriate for a character string.

The position search CAM 20 compares the search payload data PD generated by the payload data shift section 102 against a stored search character string, and outputs a matching search character string in the payload data. Additionally, the position search CAM 20 outputs detected search character string information (rule number, shift value, etc.). The control circuit 104, which is coupled to the position search CAM 20 and to the original search CAM 30, generates search data to be inputted to the original search section 200. The control circuit 104 operates when an entry stored in the position search CAM 20 matches the search payload data PD. The search data information extraction circuit 106 extracts search data information (keyword information) that includes information indicating a search character string (entry value) detected in the position search CAM 20 (rule number) and the number of bytes the search payload data PD in which the search character string is detected is shifted (position information). The search data generation circuit 108 generates, from the search data information and payload data, search data to be given to the original search section 200.

Referring to FIG. 6, a search operation in the semiconductor device 1 shown in FIG. 5 will now be described in detail. During the search operation shown in FIG. 6, it is assumed that the shift amount of the payload data is 4 bytes. Accordingly, the search rule (position rule) stored beforehand in the position search CAM 20 is formed of an 8-byte character string (entry value). The search rule (original rule) stored beforehand in the original search CAM 30 is formed of a 64-byte character string (entry value). That is, the semiconductor device 1 shown in FIG. 6 is capable of searching for a character string of up to 64 bytes in length. Further, an exemplary search operation performed when the character string is "Warning!" is depicted.

The payload data shift section 102 shifts the payload data a predetermined number of bytes (4 bytes in the example of FIG. 6) at a time and sequentially outputs 8-byte search payload data PD to the position search CAM 20. In the example of FIG. 6, the search payload data PD0 "ABcdEfWa" (when the number of shifts=0), the search payload data PD1 "EfWarnin" (when the number of shifts=1), the search payload data PD2 "rnin!Op" (when the number of shifts=2), and so on are sequentially outputted in the order named.

The position search CAM 20 stores a plurality of entries for each of a plurality of search character strings. More specifically, the position search CAM 20 stores a plurality of entries for which different offsets are given to a part of each search character string in accordance with the number of data (the number of shift bytes) shifted by the payload data shift section 102.

In the example of FIG. 6, the position search CAM 20 stores a search rule (position rule) formed of an 8-byte (that is, 4 bytes multiplied by 2) character string (entry value) in response to a 4-byte shift in the payload data shift section 102. In particular, the position search CAM 20 pre-stores character strings obtained by shifting one byte at a time, that is, for example, an entry PDE0 "Warning!", an entry PDE1 "*Warning", an entry PDE2 "Warnin", and an entry PDE3 "*Warni".

In other words, for one entry in the original search CAM 30, the same number of entries as the number of bytes the payload data is shifted by the payload data shift section 102 are required as search rules to be stored in the position search CAM 20. When, for example, the payload data shift section 102 performs a 4-byte shift, four entries are required for the position search CAM 20. When the payload data shift section 102 performs an 8-byte shift, eight entries are required for the position search CAM 20.

For each search rule stored in the position search CAM 20, the position of each entry and the position of the beginning of a search character string are stored in association with each other. That is to say, the search rules are orderly stored so that the position where a search character string exists within the search payload data (shift value) can easily be calculated from an address at which an entry in the position search CAM 20 is stored.

As illustrated in FIG. 6, it is preferred that a fuzzy search method be employed to determine that a hit has occurred when a part of the search character string matches (when at least a predetermined number of characters match). As indicated in FIG. 6, if the character string "Warning!" is searched for, it is determined that a match (hit) has occurred when a 5-byte character string "Warni", a 6-byte character string "Warnin", a 7-byte character string "Warning", or an 8-byte character string "Warning!" matches. That is, in the example of FIG. 6, it is determined that a match (hit) has occurred when at least five characters of the search character string match. Using such a fuzzy search method makes it possible to reduce the usage rate of a content-addressable memory. If the payload data shift section 102 performs an N-byte shift and the search rules stored in the position search CAM 20 are M bytes in character string length, an (M−N+1) to M-byte fuzzy search is executed.

In the example of FIG. 6, no entry stored in the position search CAM 20 matches (so that a miss has occurred) the first search payload data PD0 "ABcdEfWa" (when the number of shifts=0). The entry PDE2 "**Warnin" matches the next search payload data PD1 "EfWarnin" (when the number of shifts=1). The position search CAM 20 outputs "4n+2" as a matching address (HitAdd) indicative of the entry PDE2. Here, "n" is an integer of 1 or greater (the same holds true hereinafter).

When a portion matching the search character string is detected in the payload data as a result of a search executed in the position search CAM 20, the control circuit 104 extracts search data from the payload data in accordance with the position information about the detected portion matching the search character string, and inputs the extracted search data to the original search CAM 30. More specifically, the control circuit 104 (search data information extraction circuit 106) extracts search data information from the search payload data PD "EfWarnin . . . " corresponding to the search payload data PD1 "EfWarnin" and from the matching address "4n+2". The search data information includes the rule number "4n", which represents a matching search rule in the position search CAM 20, the shift value "2", which is offset information obtained when the matching search rule is detected in the position search CAM 20, and the number of shifts "1", which is the start position information about the search character string in the payload. The search data information extraction circuit 106 separates the matching address "4n+2" into the rule number "4n" and the shift value (offset information) "2". As described above, the search data information, which is the position information about a portion matching the search character string, includes information (rule number) identifying a search character string corresponding to a matching entry in the position search CAM 20 and information (shift value) about its offset.

The control circuit 104 (search data generation circuit 108) generates search data in accordance with the search data information and gives the generated search data to the original search CAM 30. More specifically, the control circuit 104 acquires the start position information about the character string "Warning!", which is the character string to search for in the payload data, by extracting and combining the number of 4-byte shifts performed by the payload data shift section 102 and the shift value "2" derived from the position search CAM 20.

The search data generation circuit 108 generates shifted search data (SPD) by subjecting payload data #1 "EfWarning!OpQCaution!VwXYZ . . . ", which is used when the number of shifts is "1", to a 2-byte leftward shift in accordance with the shift value "2" calculated by the search data information extraction circuit 106. In the example of FIG. 6, the shifted search data is "Warning!OpQCaution!VwXYZ . . . ".

The original search CAM 30 stores a required number of bytes of data from the beginning of each search character string. If, for example, the search character string is "Warning!", "Warning!********" is stored as the entry DE0 of the original search CAM 30. For characters following the first 8 bytes, which may be any characters, "* (asterisk)" (don't care) is designated. Characters at positions where "*" is designated are constantly determined to be a match (hit) irrespective of the value of a comparison target.

In the example of FIG. 6, as the original search CAM 30 is configured to be capable of storing a 64-byte character string (entry value), up to 64-byte characters can be designated (when one character is formed of one byte)

The original search CAM 30 determines whether the shifted search data (SPD) "Warning!OpQCaution!VwXYZ . . . ", which is generated by the control circuit 104 (search data generation circuit 108), matches the stored search rules. In the example of FIG. 6, as the shifted search data (SPD) "Warning!OpQCaution!VwXYZ . . . " matches the entry DE0 "Warning!******" in the original search CAM 30, the original search section 200 outputs, for example, a match signal and the address at which the entry DE0 "Warning!******" is stored, for instance, to the host controller as a comparison result (HitIndex).

As described above, even when the number of shift bytes of payload data in the payload data shift section 102 is increased to improve the search throughput, the position search CAM 20 is merely requested to execute a partial search on a predetermined number of leading bytes of payload data (for example, 8 bytes). This makes it possible to suppress an increase in the memory capacity. Further, the start position of a search character string in the payload data can be rapidly acquired by using the result of a position search (partial search) in the position search CAM 20.

Moreover, when a plurality of search rules (original rules) to be stored in the original search CAM 30 are identical with corresponding search rules (position rules) to be stored in the position search CAM 20, the search table to be stored in the position search CAM 20 can be further reduced in size. That is to say, if, when a new search rule is to be registered in the original search CAM 30, the corresponding position rule is the same as a position rule already registered in the position search CAM 20, a new position rule need not be registered. This makes it possible to not only reduce the memory capacity of the CAM to be incorporated into the search engine but also decrease the number of steps in a search flow.

In the semiconductor device 1 according to the first embodiment, the payload data shift section 102 performs a search operation by shifting the payload data four bytes at a time. The effect of suppressing a memory capacity increase by adopting such a 4-byte shift search will be described in comparison with an integrated circuit having a built-in CAM according to the related art illustrated in FIG. 1.

When a 4-byte shift search is executed by using the position search CAM 20 in the semiconductor device 1 according to the first embodiment, the resulting search throughput is four times higher than when a 1-byte shift search is executed. The memory capacity can also be reduced in addition to an increase in the search throughput.

For example, if it is assumed that the memory capacity of a CAM array required for a 1-byte shift search is 256 kbits (=64 bytes (maximum search character string length)×8× 512 entries) in the integrated circuit having a built-in CAM according to the related art illustrated in FIG. 1, the required memory capacity is 1024 kbits (256 kbits×4) because four times the memory capacity of the CAM array is required to achieve a search throughput four times higher.

Meanwhile, the memory capacity required for the position search CAM 20 in the semiconductor device 1 according to the first embodiment is 128 kbits (=8 bytes (search character string length required for a partial search)×8×4-byte shift× 512 entries). The memory capacity required for the original search CAM 30 is 256 kbits, as is the case with the CAM array memory capacity of the integrated circuit having a built-in CAM according to the related art illustrated in FIG. 1. Thus, the overall memory capacity required for the semiconductor device 1 according to the first embodiment is 384 kbits (=128 kbits+256 kbits). It signifies that the required overall memory capacity is decreased to 37.5% (=384 kbits/1024 kbits) of the value required when a 4-byte shift is implemented by the integrated circuit having a built-in CAM according to the related art. In short, the required memory capacity can be reduced by approximately 60%.

That is to say, when the memory capacity of the position search CAM 20 is configured to be smaller than the memory capacity of the original search CAM 30, the overall memory capacity of circuitry can be made smaller than when a multiple-byte shift search is executed by the integrated circuit having a built-in CAM according to the related art illustrated in FIG. 1.

When the above memory capacity reduction effect is generalized, the following result is obtained. The memory capacity is expressed by the equations below when the number of payload data shift bytes is S, the number of bytes per entry stored in the position search CAM 20 is P, the number of bytes per entry stored in the original search CAM 30 is K, and the number of entries stored in the original search CAM 30 is R.

Memory capacity of the semiconductor device 1 according to the first embodiment $$(\text{position search CAM 20} + \text{original search CAM 30}) = (P \times R \times S) + (K \times R) \qquad (1)$$

Memory capacity of the integrated circuit having a built-in CAM according to the related art $$(\text{CAM array memory capacity}) = K \times R \times S \qquad (2)$$

It should be noted that the memory capacity of the integrated circuit having a built-in CAM according to the related art is increased S-fold to obtain the same search throughput. When the following relational expression is established, the memory capacity of the semiconductor device 1 according to the first embodiment can be made smaller as compared with the related art.

$$P < (S-1) \times K/S \qquad (3)$$

If, for instance, the number of shift bytes S=4 and the number of bytes K per entry stored in the original search CAM 30=64 bytes, the footprint and the power consumption can be reduced as far as the number of bytes P per entry stored in the position search CAM 20 is smaller than 48.

Further, if the number of shift bytes S=16 and the number of bytes K per entry stored in the original search CAM 30=64 bytes, the footprint and the power consumption can be reduced as far as the number of bytes P per entry stored in the position search CAM 20 is smaller than 60.

Incidentally, the integrated circuit having a built-in CAM according to the related art requires the same number of entries as the number of shift bytes. However, as for the semiconductor device 1 according to the first embodiment, search rules having the same rule number need not be registered as separate entries in the position search CAM 20. This makes it possible to further reduce the footprint and the power consumption.

In the semiconductor device 1 according to the first embodiment, the position search CAM 20 does not check for a perfect match, but executes a fuzzy search by using a predetermined number of bytes (5 to 8 bytes in the above description, that is, 5 or more bytes). Executing such a fuzzy search makes it possible to not only increase a match detection rate (the probability at which a character string determined to be a match in the position search CAM 20 is also determined to be a match in the original search CAM 30) but also shorten the character string (entry value) to be stored as a search rule in the position search CAM 20. That is to say, a character string matching a search character string can be searched for easily and rapidly arid the required memory capacity can be reduced.

Moreover, the integrated circuit having a built-in CAM according to the related art illustrated in FIG. 1 uses the large-capacity CAM array 911 to perform a search operation on each operating cycle. However, the semiconductor device 1 according to the first embodiment uses the large-capacity original search CAM 30 to execute an original search (full-text search) only when a match is outputted from the small-capacity position search CAM 20. That is to say, the original search CAM 30 performs a search operation when a portion matching the search character string is detected by the position search CAM 20. This makes it possible to reduce the power consumption required for a keyword search.

The semiconductor device 1 according to the first embodiment is also effective when a search involving the use of a long search character string is requested. When, for instance, an 8-byte shift search is executed to increase the search throughput by using a method illustrated in FIG. 3, a CAM array of 72 bytes in width is required for a search system in which one entry corresponds to 64 bytes (the value "72" is obtained by adding the character string length of one entry to the number of shift bytes). When the number of shift bytes is to be further increased to raise the speed of a keyword search, a CAM array having a bit width corresponding to the number of shift bytes is required.

That is to say, if a search needs to be executed rapidly by using a long search character string, it is conceivable that implementation may be difficult to achieve due to hardware restrictions (typically, a CAM array having a great bit width cannot be implemented) when a certain method is used to increase the number of shift bytes as illustrated in FIG. 3. Meanwhile, when the number of shift bytes is increased, the semiconductor device 1 according to the first embodiment needs to increase the bit width of the position search CAM 20 and not the bit width of the original search CAM 30. The bit width of the original search CAM 30 is determined based only on the maximum length of a required search character string. As such being the case, the semiconductor device 1 according to the first embodiment is unlikely to be affected by the hardware restrictions that may be imposed during the use of the integrated circuit having a built-in CAM according to the related art. Therefore, the implementation can be achieved with increased ease by the semiconductor device 1 according to the first embodiment.

As described above, the semiconductor device 1 according to the first embodiment employs the original search CAM 30 in combination with the position search CAM 20, which has a smaller memory capacity than the original search CAM 30. Therefore, an increase in the required memory capacity can be suppressed even when the number of shift bytes for inputted payload data is increased. This makes it possible to maintain low memory capacity requirements and low power consumption and achieve a high search throughput as compared to the integrated circuit having a built-in CAM according to the related art.

The start position of a character string corresponding to a search character string can be acquired at a high search throughput. Therefore, when the first embodiment is applied, for instance, to a search engine that extracts a specific keyword (search character string) from an HTTP (HyperText Transfer Protocol) header, a character string, for example, can be extracted at the wire speed of a network.

[D. Second Embodiment]

The semiconductor device 1 according to the first embodiment, which is described above, uses the position search CAM 20 to execute a position search (partial search). A configuration for implementing the position search (partial search) with increased efficiency is exemplified below.

Figure 7:
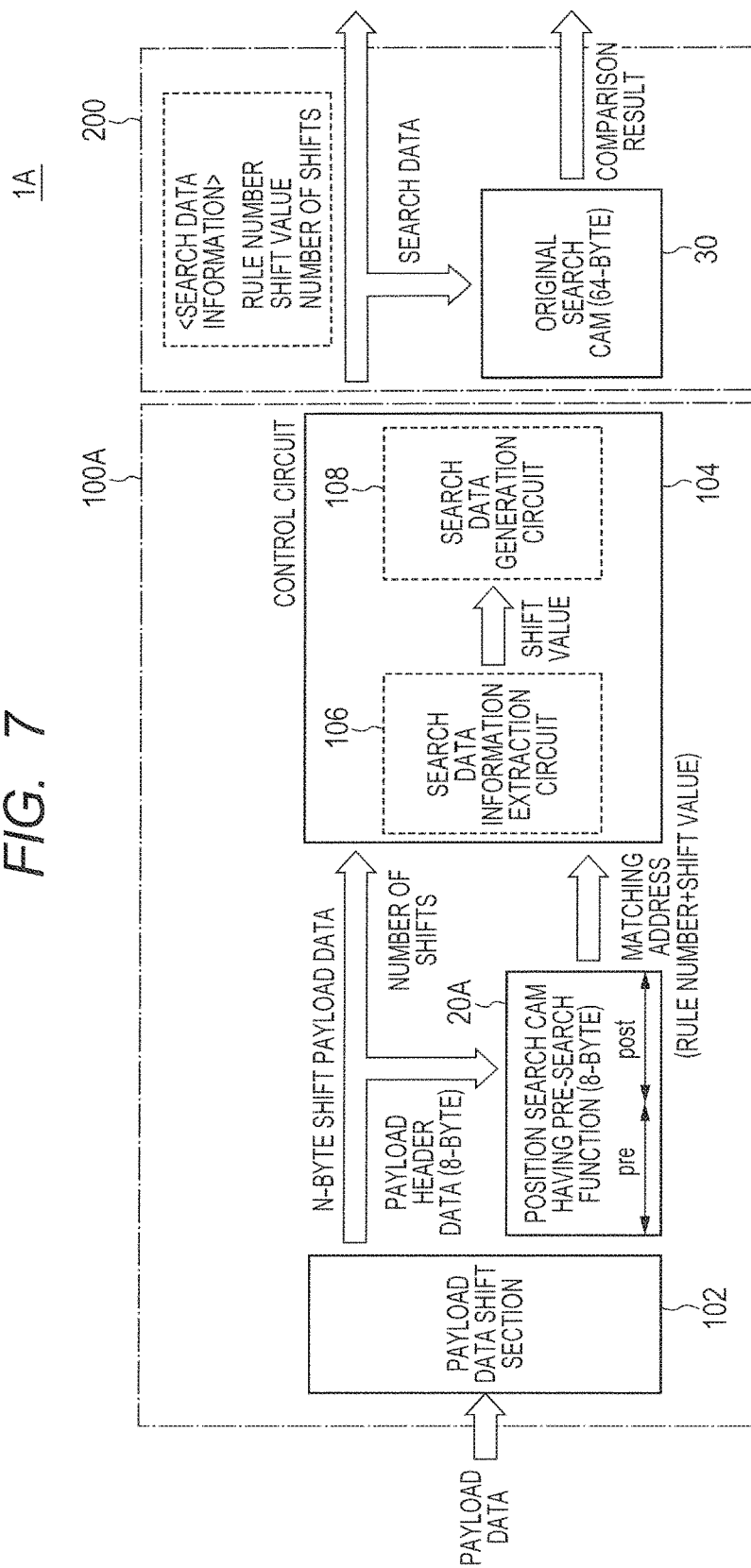
FIG. 7 is a schematic diagram illustrating a configuration of essential parts of the semiconductor device according to a second embodiment of the present invention.
Figure 8:
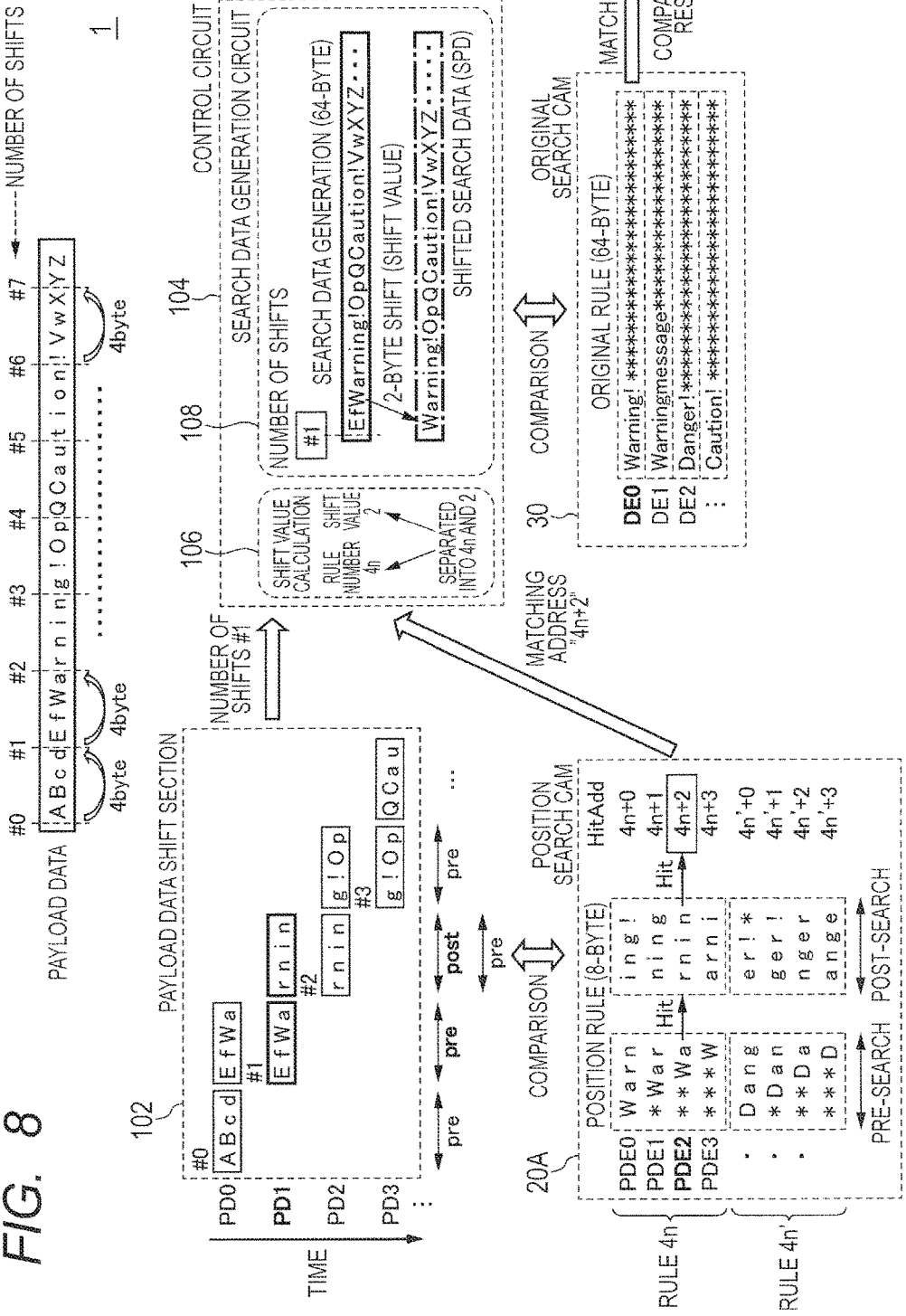
FIG. 8 is a schematic diagram illustrating a search operation that is performed on payload data by using the semiconductor device shown in FIG. 7.

FIG. 7 is a schematic diagram illustrating a configuration of essential parts of a semiconductor device 1A according to a second embodiment of the present invention. FIG. 8 is a schematic diagram illustrating a search operation that is performed on payload data by using the semiconductor device 1A shown in FIG. 7.

The semiconductor device 1A according to the second embodiment is obtained by replacing the position search CAM 20 in the position search section 100 with a position search CAM 20A having a pre-search function. The other elements of the semiconductor device 1A are the same as corresponding elements of the semiconductor device 1 shown in FIG. 5 and will not be redundantly described in detail.

The position search CAM 20A has the pre-search function, which executes a multi-level search on inputted search payload data. In the example of FIGS. 7 and 8, the position search CAM 20A divides 8-byte search payload data into leading four bytes and trailing four bytes, and executes a search (hereinafter may be referred to as the "pre-search") on the leading four bytes and a search (hereinafter may be referred to as the "post-search") on the trailing four bytes. The post-search is executed only when the result of the pre-search indicates a match (hit). Executing the above-described multi-level search makes it possible to reduce the overall power consumption of circuitry.

The position search CAM 20A determines whether a first portion of search target data in the payload data matches a portion (pre-search portion) of the search character string (a part of the search character string) that corresponds to the first portion. When the first portion is determined to be a match, the position search CAM 20A determines whether a second portion, which is different from the first portion of the search target data, matches a portion (post-search portion) of the search character string (a part of the search character string) that corresponds to the second portion.

Referring to FIG. 8, a search operation performed by the semiconductor device 1A shown in FIG. 7 will now be described in detail. Operations other than the operation of the position search CAM 20A are the same as the search operations performed by the semiconductor device 1 according to the first embodiment illustrated in FIG. 6 and will not be redundantly described in detail. FIG. 8 illustrates an exemplary search operation performed when the search character string is "Warning!".

The payload data shift section 102 shifts the payload data a Predetermined number of bytes (four bytes in the example of FIG. 8) at a time and sequentially outputs 8-byte search payload data PD to the position search CAM 20A. For the sake of explanation, the search payload data PD0-PD3 in FIG. 8 is divided into two portions, namely, leading four bytes and trailing four bytes. However, the operation of the payload data shift section 102 is the same as described in conjunction with the semiconductor device 1 according to the first embodiment.

Before executing a search, the position search CAM 20A divides the 8-byte search payload data PD0 "ABcdEfWa" (when the number of shifts=0), which is outputted from the payload data shift section 102, into a leading 4-byte portion #0 "ABcd" and a trailing 4-byte portion #1 "EfWa". The position search CAM 20A stores the same search rule (position rule) as is the case with the semiconductor device 1 according to the first embodiment. However, each character string (entry value) is divided into a pre-search portion and a post-search portion.

First of all, the position search CAM 20A executes a pre-search. The pre-search is executed by comparing the leading portion #0 "ABcd" of the search payload data PD0 against the stored pre-search portion of each search rule. In the example of FIG. 8, the leading portion #0 "ABcd" of the first search payload data PD0 does not match the pre-search portion of any entry value stored in the position search CAM 20A (a miss occurs). Thus, the post-search is not to be executed on the search payload data PD0.

Next, the position search CAM 20A executes a search on the search payload data PD1 "EfWarnin", which is a result of a 4-byte shift. As the leading portion #1 "EfWa" of the search payload data PD1 matches the pre-search portion "**Wa" of an entry PDE2 stored in the position search CAM 20A (a hit occurs), a post-search is executed. More specifically, the position search CAM 20A executes the post-search by comparing the trailing portion #2 "rnin" of the search payload data PD1 against the post-search portion "rnin" of the entry PDE2 whose pre-search portion was a match. In the example of FIG. 8, the trailing portion #2 "rnin" of the search payload data PD1 matches the post-search portion "rnin" of the entry PDE2.

If both the pre-search portion and the post-search portion are determined to be a match (hit), the position search CAM 20A outputs "4n+2" as a matching address (HitAdd) indicative of the entry PDE2. As is the case with the semiconductor device 1 according to the first embodiment, the search data information extraction circuit 106 separates the matching address "4n+2" into the rule number "4n" and the shift value (offset information) "2". The control circuit 104 (search data generation circuit 108) generates search data in accordance with search data information and gives the generated search data to the original search CAM 30.

As described above, when the result of the pre-search is determined to be a mismatch (miss), the position search CAM 20A in the semiconductor device 1A according to the second embodiment does not execute the post-search. That is to say, the pre-search is repeatedly executed without executing the post-search until the result of the pre-search is determined to be a match (hit). In this manner, the execution of an unnecessary post-search is suppressed. This makes it possible to further reduce the power consumption as compared to the semiconductor device 1 according to the first embodiment.

[E. Third Embodiment]

The semiconductor device 1 according to the first embodiment executes the original search (full-text search) by using the original search CAM 30. A configuration for implementing the original search (full-text search) with increased efficiency is exemplified below.

Figure 9:
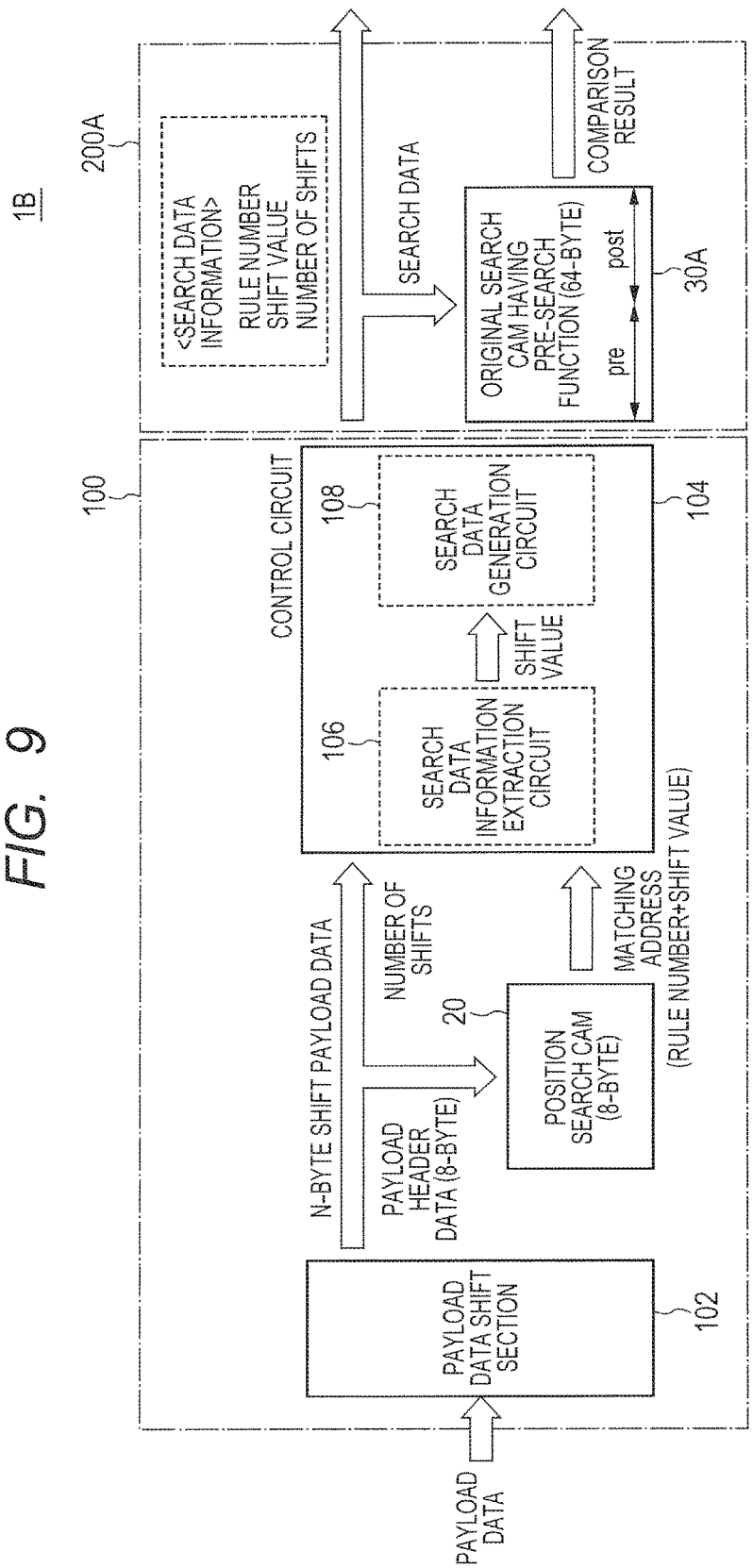
FIG. 9 is a schematic diagram illustrating a configuration of essential parts of the semiconductor device according to a third embodiment of the present invention.
Figure 10:
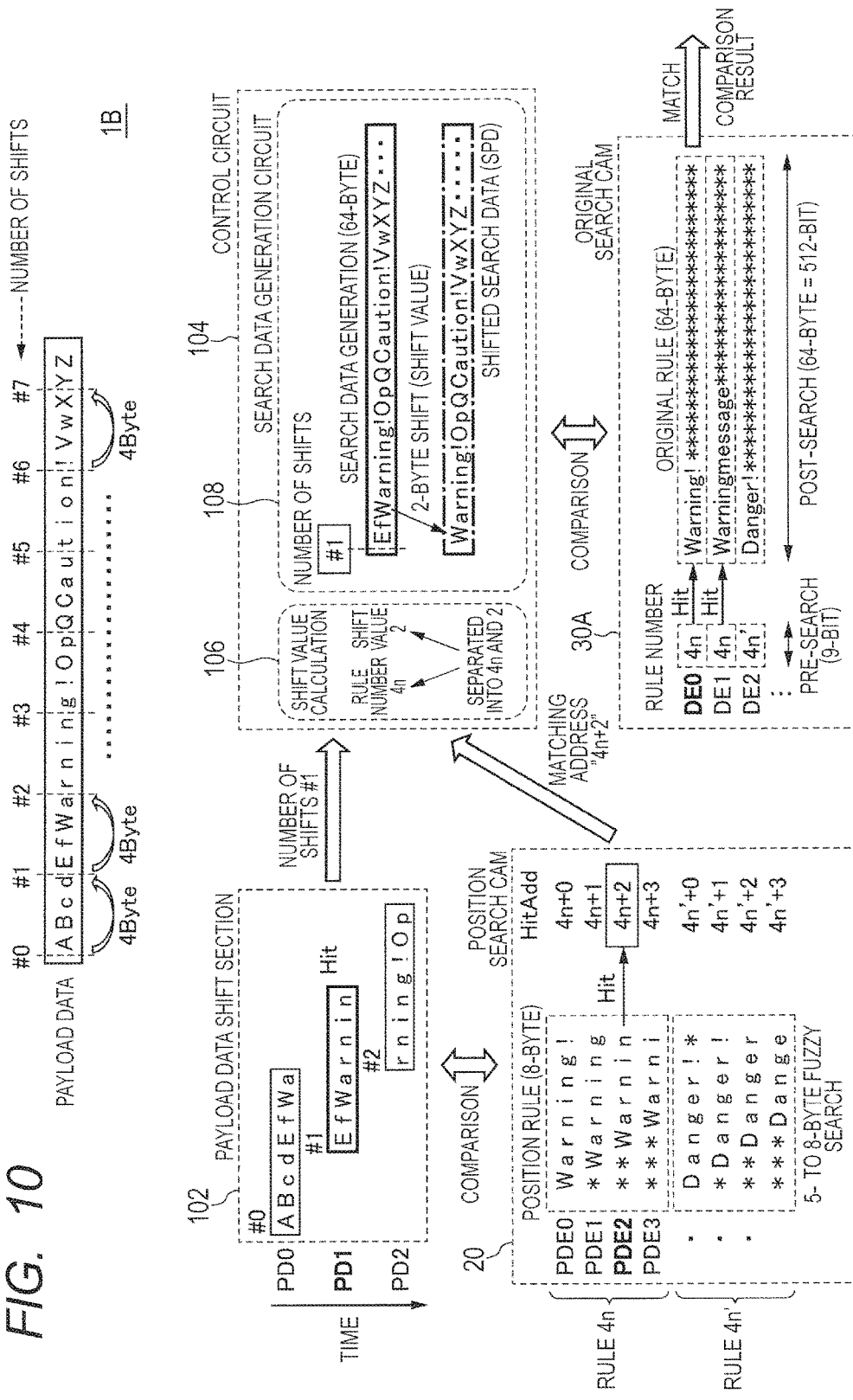
FIG. 10 is a schematic diagram illustrating a search operation that is performed on payload data by using the semiconductor device shown in FIG. 9.

FIG. 9 is a schematic diagram illustrating a configuration of essential parts of a semiconductor device 1B according to a third embodiment of the present invention. FIG. 10 is a schematic diagram illustrating a search operation that is performed on payload data by using the semiconductor device 1B shown in FIG. 9.

The semiconductor device 1B according to the third embodiment is obtained by replacing the original search CAM 30 in the original search section 200 with an original search CAM 30A having a pre-search function. The other elements of the semiconductor device 1B are the same as corresponding elements of the semiconductor device 1 shown in FIG. 5 and will not be redundantly described in detail.

The original search CAM 30A has the pre-search function, which is exercised to execute a multi-level search on inputted search data. In the examples of FIGS. 7 and 8, the original search CAM 30A executes a search (hereinafter may be referred to as the "pre-search") on a rule number outputted from the position search section 100 (search data information extraction circuit 106) and executes a search (hereinafter may be referred to as the "post-search") on search data by using a search rule (original rule) corresponding to the rule number. That is to say, the original search section 200A in the semiconductor device 1B according to the second embodiment executes the pre-search by using a rule number that is extracted from matching address information indicative of the entry PDE2, which was a match in the position search CAM 20A. In the post-search, the original search (full-text search) is executed only on entries that are found to be a match in the pre-search.

Referring to FIG. 10, a search operation performed by the semiconductor device 1B shown in FIG. 9 will now be described in detail. Operations other than the operation of the original search CAM 30A are the same as the search operations performed by the semiconductor device 1 according to the first embodiment illustrated in FIG. 6 and will not be redundantly described in detail. FIG. 10 illustrates an exemplary search operation performed when the search character string is "Warning!".

It is assumed that the semiconductor device 1B according to the third embodiment is capable of searching for a character string of up to 64 bytes in length. The original search CAM 30A stores not only a plurality of search character strings (search rules), but also information (information indicative of a rule number) that is attached to each search character string for character string identification. More specifically, the original search CAM 30A stores, for each entry, 512 bits (=64 bytes) corresponding to a search character string and 9 bits indicative of the rule number of the search character string. The search rule (original rule) indicative of a search character string is the same as described in conjunction with the semiconductor device 1 according to the first embodiment. Data of the 9 bits corresponds to a search rule that is used for the pre-search in the original search CAM 30A. In the subsequent description, the 9-bit data indicative of a rule number of each entry is referred to as the "pre-search portion", and the search rule (original rule) indicative of the search character string of each entry is referred to as the "post-search portion".

If the number of entries stored in the original search CAM 30a is 512, the original search CAM 30A can be implemented by using an array configuration formed of (512+9) bits×512 entries.

In the pre-search, the original search CAM 30A extracts a search character string for use in a search from a plurality of stored search character strings in accordance with information (rule number) that identifies a search character string included in the position information from the position search CAM 20. More specifically, the original search CAM 30A compares a rule number separated by the position search section 100 (search data information extraction circuit 106) against a search rule stored in the pre-search portion. In the example of FIG. 6, the rule number "4n" separated by the search data information extraction circuit 106 matches the search rule "4n" that is associated with the entries DE0, DE1 in the original search CAM 30A. In principle, the position search (partial search) in the position search section 100 is executed by using a part of a search character string used in the original search (full-text search). Therefore, a certain entry is found to be a match in the pre-search in the original search CAM 30A.

Subsequently, the original search CAM 30A executes the original search (full-text search) on search data, as the post-search, by using an entry corresponding to a matching entry found in the pre-search. In the example of FIG. 6, the entries DE0, DE1 matching the search rule "4n" in the pre-search are used as a search rule (original rule) for the original search (full-text search).

In the post-search, the original search CAM 30A determines whether the shifted search data (SPD) "Warning!OpQCaution!VwXYZ . . . " generated by the control circuit 104 (search data generation circuit 108) matches the search rules stored as the entries DE0, DE1. In the example of FIG. 6, as the shifted search data (SPD) "Warning!OpQCaution!VwXYZ . . . " matches the entry DE0 "Warning!\*\*\*\*\*\*\*\*" in the original search CAM 30A, the original search section 200A outputs, for example, a match signal and the address at which the entry DE0 "Warning!\*\*\*\*\*\*\*\*" is stored, for instance, to the host controller as a comparison result (HitIndex).

As described above, the original search CAM 30A in the semiconductor device 1B according to the third embodiment executes the pre-search by using search data information outputted from the position search section 100 in order to narrow down to a search rule (original rule) targeted for the original search (full-text search). In this manner, the execution of an unnecessary original-search (full-text search) is suppressed. This makes it possible to further reduce the power consumption as compared to the semiconductor device 1 according to the first embodiment.

[F. Fourth Embodiment]

The second embodiment has been described in relation to the semiconductor device 1A that has the position search CAM 20A having the pre-search function. The third embodiment has been described in relation to the semiconductor device 1B that has the original search CAM 30A having the pre-search function. A more efficient search can be implemented by combining the position search CAM 20A and the original search CAM 30A.

Figure 11:
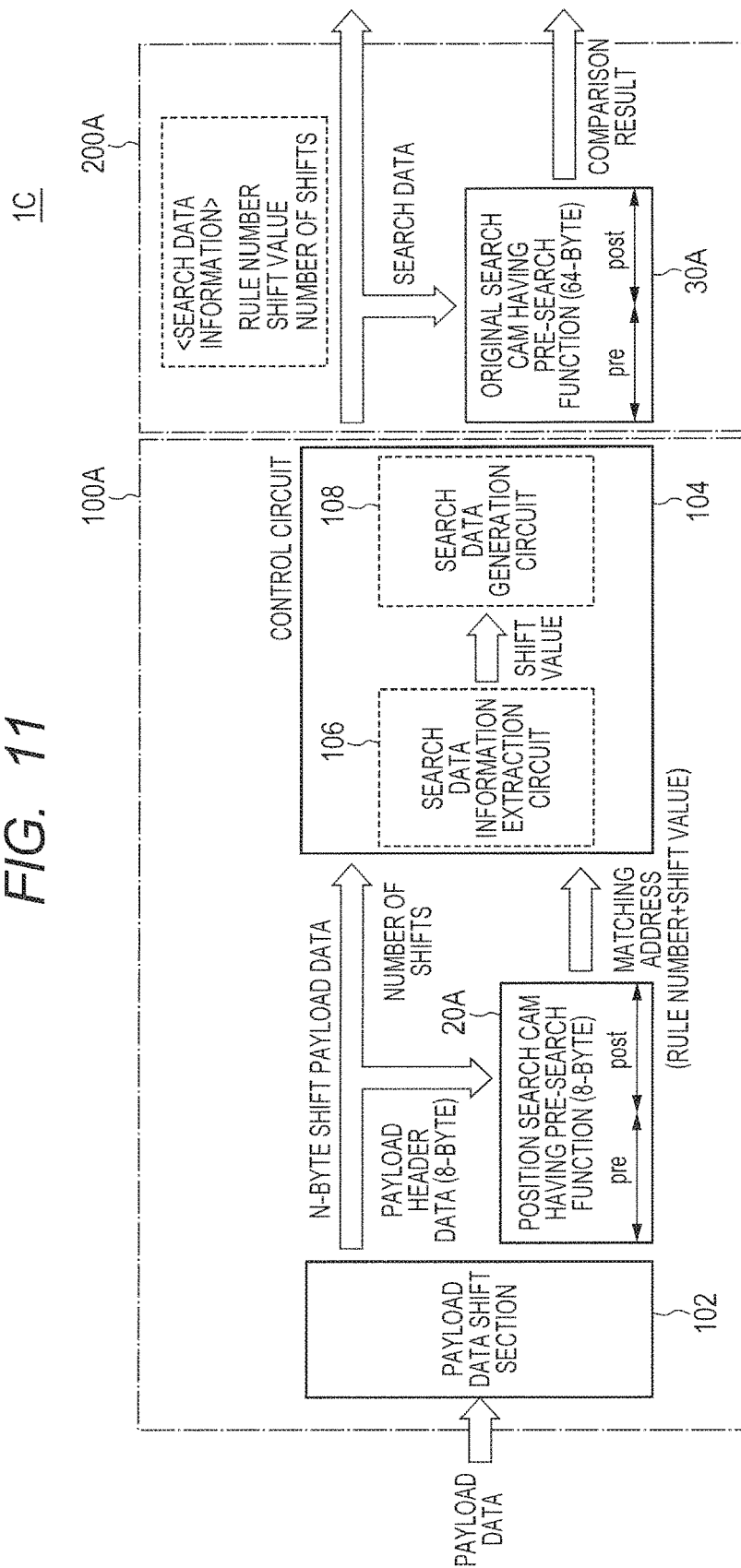
FIG. 11 is a schematic diagram illustrating a configuration of essential parts of the semiconductor device according to a fourth embodiment of the present invention.
Figure 12:
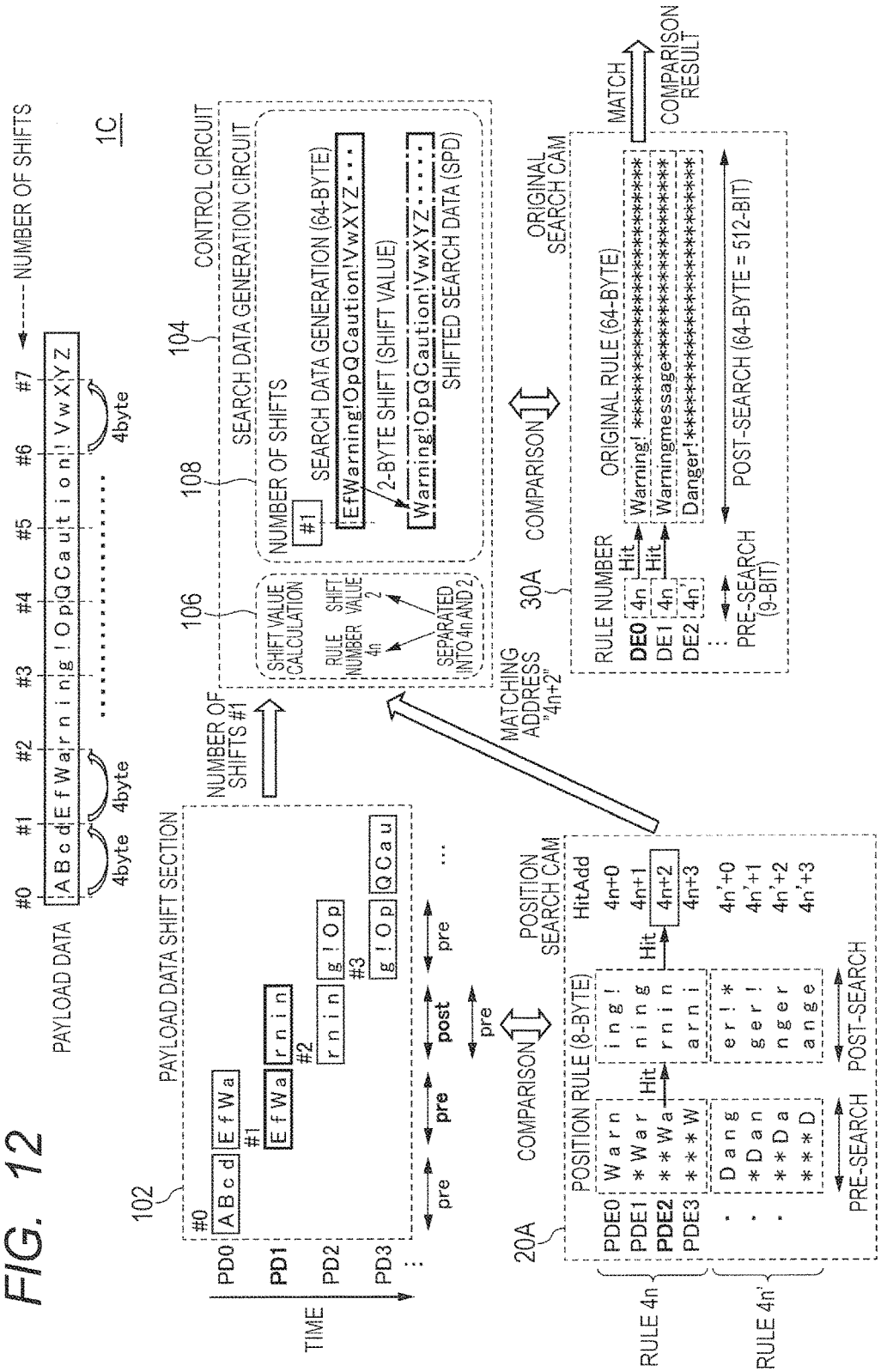
FIG. 12 is a schematic diagram illustrating a search operation that is performed on payload data by using the semiconductor device shown in FIG. 11.

FIG. 11 is a schematic diagram illustrating a configuration of essential parts of a semiconductor device 1C according to a fourth embodiment of the present invention. FIG. 12 is a schematic diagram illustrating a search operation that is performed on payload data by using the semiconductor device 1C shown in FIG. 11.

The semiconductor device 1C according to the fourth embodiment is obtained by combining the position search section 100A of the semiconductor device 1A according to the second embodiment shown in FIG. 7 with the original search section 200A of the semiconductor device 1B according to the third embodiment shown in FIG. 9. The configurations and operations of the position search section 100A and original search section 200A have been described in conjunction with the second embodiment and third embodiment, respectively, and will not be redundantly described in detail. The other elements are the same as the corresponding elements of the semiconductor device 1 shown in FIG. 5 and will not be redundantly described in detail.

FIG. 12 illustrates a search operation performed in the semiconductor device 1C according to the fourth embodiment. In the semiconductor device 1C, the position search section 100A executes a pre-search and a post-search as illustrated in FIG. 8, and the original search section 200A executes a pre-search and a post-search as illustrated in FIG. 10.

A power consumption reduction effect exercised because the position search section 100A (position search CAM 20A) and the original search section 200A (original search CAM 30A) both have the pre-search function is exemplified below.

Let us assume, for example, that the consumption current required for a search operation of the original search CAM 30 having a memory capacity of 256 kbits (=64 bytes (maximum search character string length×512 entries) is 100 mA. In this instance, the consumption current required for a search operation of the position search CAM 20A ready for a 4-byte shift is calculated to be 50 mA (=100 mA×(128 kbits/256 kbits)×1.0), and the consumption current required for a search operation of the original search CAM 30A having a memory capacity of 260.5 kbits (=(64 bytes+9 bits)×512 entries) is calculated to be 102 mA (=(260.5 kbits/256 kbits)×100 mA). It is assumed that the match rate (hit rate) in the position search CAM 20A is 100%.

If the match rate (hit rate) in the position search CAM 20A is 100% (worst conditions) when a 4-byte shift search is executed, the consumption current required for a search operation in the semiconductor device 1 according to the first embodiment is 400 mA (=100 mA×4 times). In the semiconductor device 1C according to the fourth embodiment, however, the total consumption current in the position search CAM 20A and the original search CAM 30A is 152 mA (=50 mA+102 mA). It signifies that the consumption current can be reduced by approximately 62% even under the worst conditions.

As described above, employing the position search CAM 20A having the pre-search function and/or the original search CAM 30A having the pre-search function makes it possible to further reduce the power consumption as compared to the semiconductor device 1 according to the first embodiment.

As described in conjunction with the second to fourth embodiments, when the result of the pre-search is determined to be a mismatch (miss) during the use of the position search CAM 20A having the pre-search function and/or the original search CAM 30A having the pre-search function, the subsequent post-search is skipped. Therefore, the power consumption can be reduced.

[G. Fifth Embodiment]

The second and fourth embodiments have been described in relation to a search system that uses the position search CAM 20A having the pre-search function. A fifth embodiment of the present invention, which incorporates a plurality of position search CAMs 20A in order to increase the search throughput, will now be described.

Figure 13:
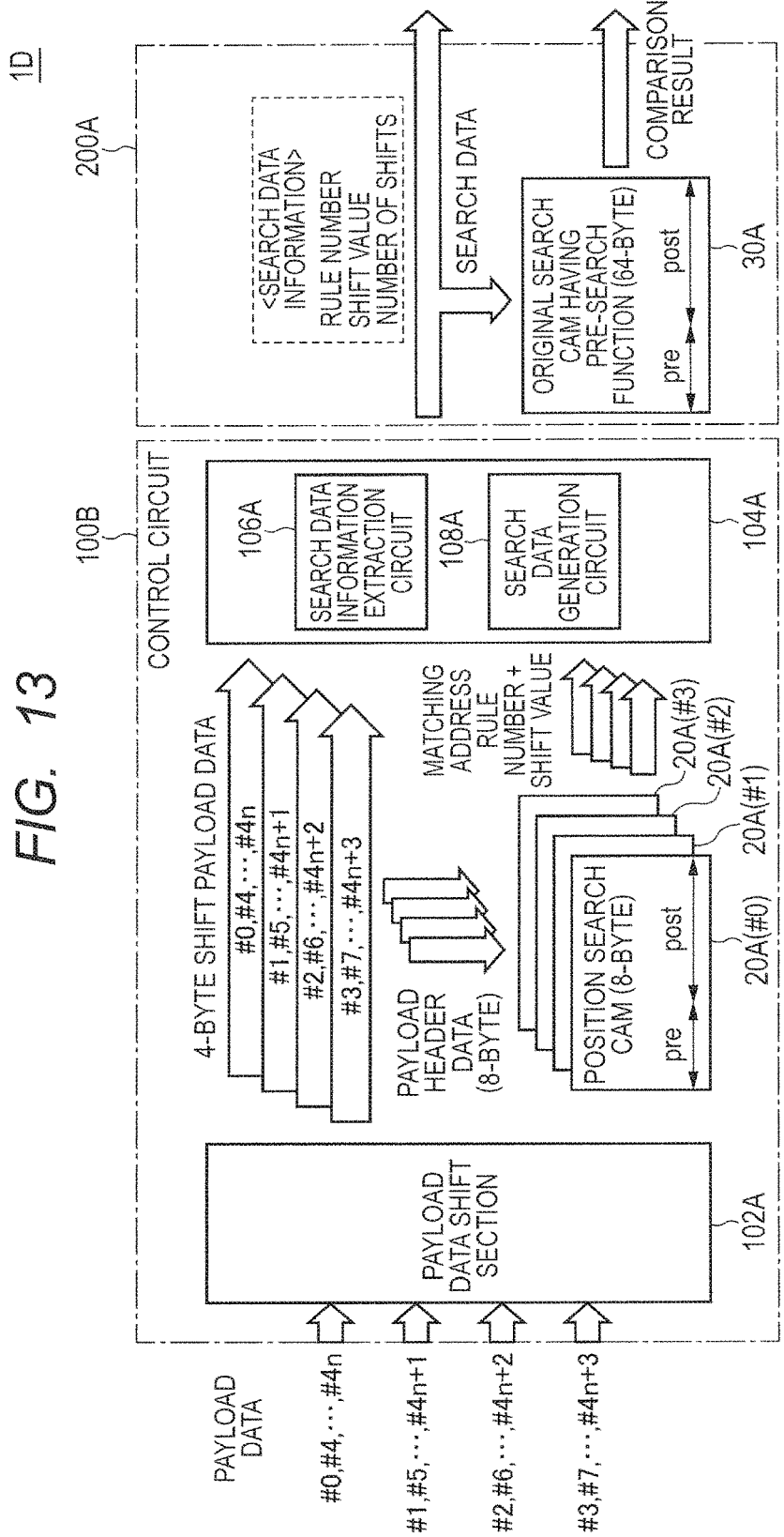
FIG. 13 is a schematic diagram illustrating a configuration of essential parts of the semiconductor device according to a fifth embodiment of the present invention.
Figure 14:
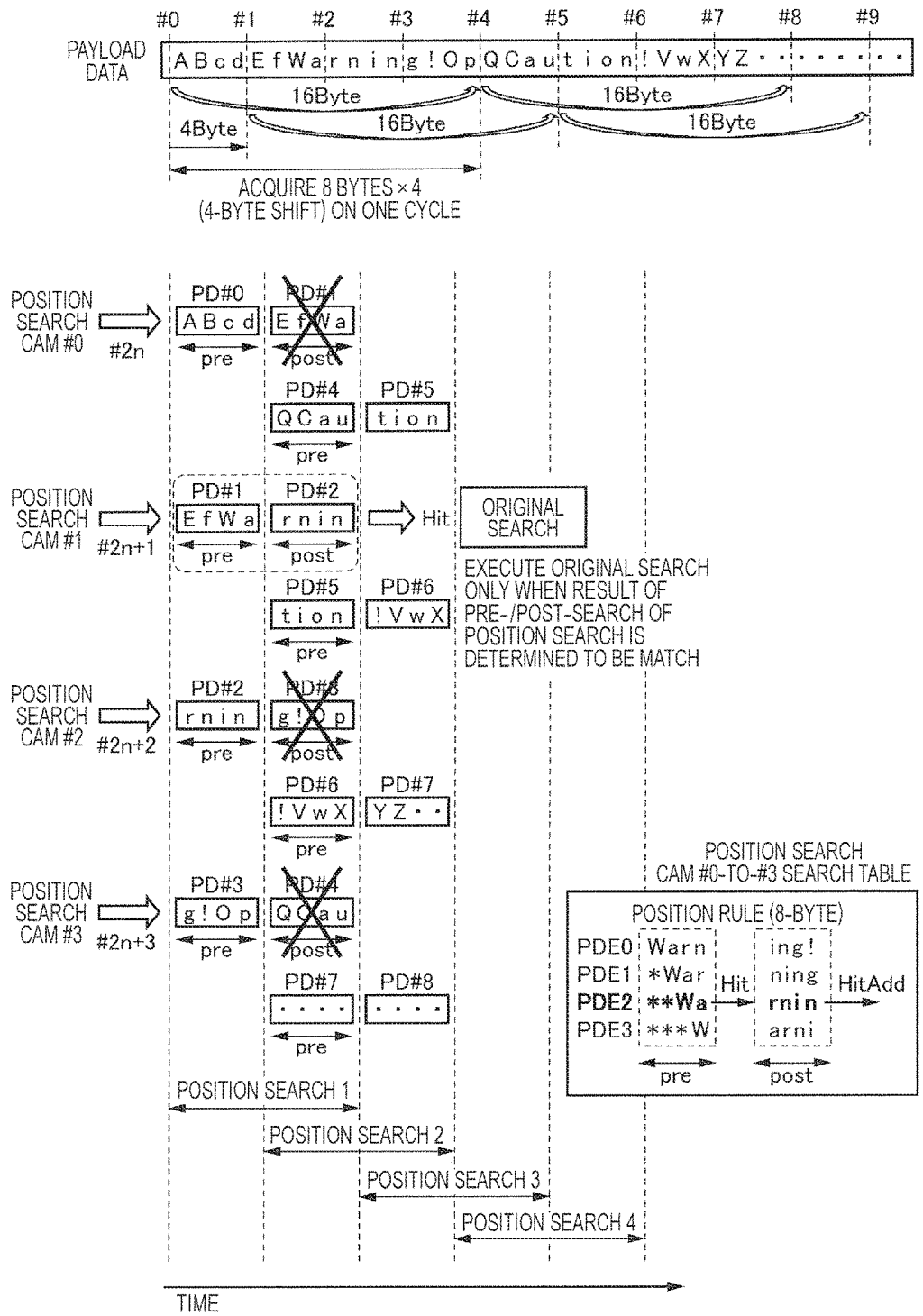
FIG. 14 is a schematic diagram illustrating a search operation that is performed on payload data by using the semiconductor device shown in FIG. 13.
Figure 15:
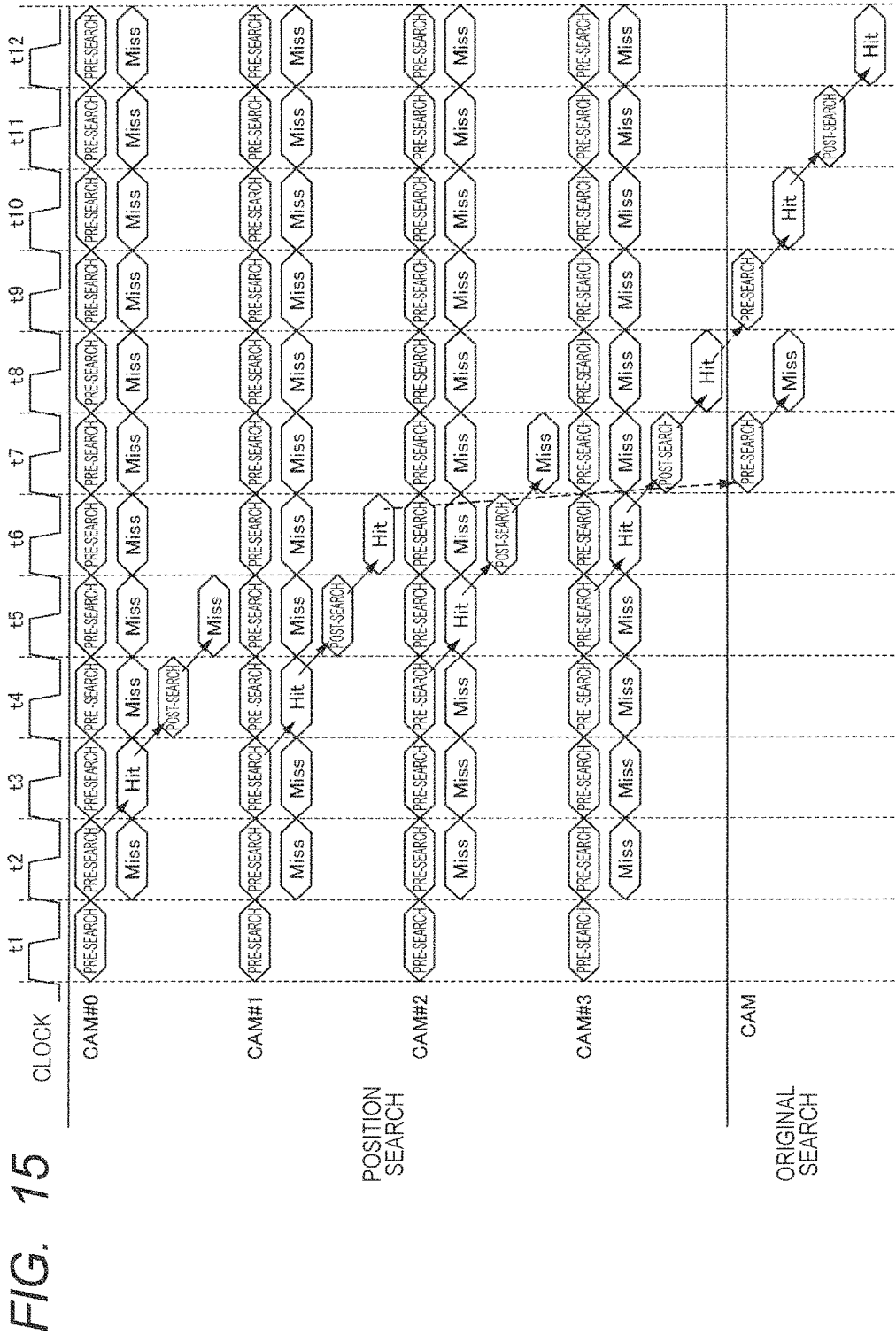
FIG. 15 is a timing diagram illustrating a search operation that is performed on payload data by using the semiconductor device shown in FIG. 13.

FIG. 13 is a schematic diagram illustrating a configuration of essential parts of a semiconductor device 1D according to the fifth embodiment. FIG. 14 is a schematic diagram illustrating a search operation that is performed on payload data by using the semiconductor device 1D shown in FIG. 13. FIG. 15 is a timing diagram illustrating a search operation that is performed on payload data by using the semiconductor device 1D shown in FIG. 13.

Referring to FIG. 13, the semiconductor device 1D includes a position search section 100B and an original search section 200A. The position search section 100B executes a position search (partial search). The original search section 200A executes an original search (full-text search).

The configuration and operation of the original search section 200A have been described in conjunction, for example, with the fourth embodiment and will not be redundantly described in detail. The original search section 200 including the original search CAM 30 described in conjunction with the first embodiment may be employed in place of the original search section 200A.

FIG. 13 illustrates an exemplary configuration formed to increase the search throughput by using four position search CAMs 20A (#0-#3) that are ready for a 4-byte shift search and provided with the pre-search function. In this configuration, the search throughput is increased 16 fold (4×4=equivalent to 16-byte shift) as compared to a 1-byte shift search.

The four position search CAMs 20A (#0-#3) store the same search rule (a part of a search character string/position rule). A payload data shift section 102A shifts the payload data a predetermined number of bytes (four bytes in the example of FIG. 13) at a time and outputs the resulting payload data to the four position search CAMs 20A as search payload data PD. As the four position search CAMs 20A parallelly search for start position information about a search character string, the speed of the position search (partial search) is multiplied by a multiple equivalent to the number of parallel position search CAMs 20A.

After each shift, the payload data shift section 102A gives, to the position search CAMs 20A (#0-#3), a plurality of search payload data for which different offset positions are set as a start position with reference to the shifted position. That is to say, the payload data shift section 102A provides the position search CAMs 20A with different positions (phase/offset) for starting the extraction of search payload data PD from the payload data.

A control circuit 104A processes a matching address (HitAdd) outputted from each of the four position search CAMs 20A to generate search data targeted for a full-text search in the original search section 200A. In particular, the control circuit 104A includes a search data information extraction circuit 106A and a search data generation circuit 108A.

The basic operation of the search data information extraction circuit 106A is the same as that of the search data information extraction circuit 106 of the semiconductor device 1 according to the first embodiment. However, the search data information extraction circuit 106A calculates the number of shifts in accordance with the position search CAM 20A at a matching address (HitAdd) output destination.

The basic operation of the search data generation circuit 108A is the same as that of the search data generation circuit 108 of the semiconductor device 1 according to the first embodiment. However, when matching addresses (HitAdds) are simultaneously outputted from two or more position search CAMs 20A, the search data generation circuit 108A adjusts the timing at which search data (shifted search data (SPD)) is to be generated and the timing at which the search data (shifted search data (SPD)) is to be outputted.

Referring to FIG. 14, a search operation in the semiconductor device 1D shown in FIG. 13 will be described. FIG. 14 illustrates an example of the search operation that is performed when the search character string is "Warning!".

The payload data shift section 102A shifts the payload data a predetermined number of bytes (four bytes in the example of FIG. 14) at a time and outputs 8-byte search payload data PD to the position search CAMs 20A. In the example of FIG. 14, the 8-byte search payload data PD#0 "ABcdEfWa"-PD#3 "g!OpQCau", which are derived from a 4-byte shift, are inputted to the position search CAMs #0-#3. The position search CAMs #0-#3 determine whether the inputted search payload data PD#0-PD#3 match the stored entries PDE0-PDE3 (search rules). As the search payload data PD are parallelly inputted to the respective position search CAMs #0-#3, the pre-searches in the position search CAM #0-#3 are executed within the same cycle.

In each of the position search CAMs #0-#3, the pre-search and the post-search can be executed parallelly within the same interval. Therefore, the pre-search for a position search is executed on every cycle. For example, the position search for position search 1 and the pre-search for position search 2 are simultaneously executed on the second cycle, and the post-search for position search 2 and the pre-search for position search 3 are simultaneously executed on the third cycle.

In position search 1, as a result of the pre-search executed in the position search CAMs #0-#3, the search payload data PD#1 "EfWa" in the position search CAM #1 matches the pre-search portion "Wa" of the entry PDE2 stored in the position search CAM #1. When the result of pre-search execution is determined to be a match (hit), the position search CAM #1 executes the post-search for position search 1. The Position search CAMs #0, #2, #3 in which the result of the pre-search is determined to be a mismatch (miss) does not execute the post-search for position search 1**.

In the post-search for position search 1, the search payload data PD#2 "rnin" matches the post-search portion "rnin" of the entry PDE2 stored in the position search CAM #1. Thus, the position search CAM #1 outputs a matching address (HitAdd) indicative of the entry PDE2. The original search (full-text search) is then executed in the original search section 200A.

Next, referring to FIG. 15, a search operation performed on payload data by using the semiconductor device 1D shown in FIG. 13 will be described. FIG. 15 is a timing diagram illustrating a 16-byte shift search that is executed by using the four position search CAMs #0-#3 having the pre-search function and the original search CAM 30 having the pre-search function.

First of all, at time t1, the position search CAMs #0-#3 execute the pre-search. Subsequently, a time t2, the position search CAMs #0-#3 not only outputs the result of the pre-search executed at time t1, but also executes the pre-search on new search payload data that is obtained by subjecting the search payload data targeted for the pre-search at time t1 to a 4-byte shift. The pre-search in the position search CAMs #0-#3 is executed at each point of time.

The result of the pre-search executed at time t1 to t2 is determined to be a mismatch (miss) in all the position search CAMs #0-#3. That is to say, the post-search is not executed in the position search CAMs #0-#3 because the results of the pre-searches executed at time t1 are outputted at time t2 and all determined to be a mismatch (miss) in the example of FIG. 15.

The result of the pre-search executed at time t2 to t3 is determined to be a match (hit) in the position search CAM #0. Subsequently, the post-search is executed in the position search CAM #0. As the result of the post-search executed at time t4 to t5 in the position search CAM #0 is determined to be a mismatch (miss), the original search (full-text search) is not executed in the original search CAM 30.

In the example shown at time t3 to t8, the results of the pre-search and post-search in the position search CAM #1 are all determined to be a match (hit); however, the result of the pre-search in the original search CAM 30 is determined to be a mismatch (miss). More specifically, the result of the pre-search executed at time t3 to t4 in the position search CAM #1 is determined to be a match (hit). Subsequently, the post-search is executed in the position search CAM #1. As the result of the post-search executed at time t5 to t6 in the position search CAM #1 is determined to be a match (hit), the original search (full-text search) is executed on search data in the original search CAM 30. As the result of the pre-search for the original search, which is executed at time t7 to t8, is determined to be a mismatch (miss), the original search terminates at this point.

As described above, the original search (full-text search) is executed only when the results of the pre-search and post-search are determined to be a match (hit) in one of the position search CAMs #0-#3.

In the example shown at time t5 to t12, the result of the position search (partial search) in the position search CAM #3 and the result of the original search (full-text search) in the original search CAM 30 are both determined to be a match (hit). More specifically, the result of the pre-search executed at time t5 to t6 in the position search CAM #3 is determined to be a match (hit). Subsequently, the post-search is executed in the position search CAM #3. As the result of the post-search executed at time t7 to t8 in the position search CAM #3 is determined to be a match (hit), the original search (full-text search) is executed on search data in the original search CAM 30. The result of the pre-search for the original search, which is executed at time t9 to t10, is determined to be a match (hit), and the result of the post-search for the original search, which is subsequently executed at time t11 to t12, is also determined to be a match (hit). Consequently, the original search CAM 30 outputs, as a comparison result (HitIndex), for example, a match signal (hit signal) and the address at which a matching entry is stored.

As described above, the search operation illustrated in FIG. 15 is repeated until a character string matching the search character string is retrieved from the inputted payload data or until all the searches on the inputted payload data are completed.

Employing the position search CAM 20A having the pre-search function makes it possible to execute the pre-search for a position search at each point of time. Thus, for example, a character string can be extracted at the wire speed of a network. Further, as the next search is executed only when the search result obtained at each point of time is determined to be a match (hit), unnecessary power consumption can be suppressed to reduce the power consumption.

As described above, using four position search CAMs 20A that are smaller in memory capacity than the original search CAM 30 and ready for a 4-byte shift search makes it possible to achieve a search throughput 16 times higher than a 1-byte shift search. In addition to an increase in the search throughput, the memory capacity can be reduced.

If a CAM array memory capacity required for a 1-byte shift search is assumed to be 256 kbits (=64 bytes (maximum search character string length)×8×512 entries) in the integrated circuit having a built-in CAM according to the related art illustrated in FIG. 1, a CAM array having a memory capacity 16 times larger than the above-mentioned CAM array memory capacity is required to achieve the search throughput 16 times higher than a 1-byte shift search. Thus, the required memory capacity is 4096 kbits (256 kbits×4).

Meanwhile, the semiconductor device 1D according to the fifth embodiment requires four position search CAMs 20 and one original search CAM 30. The four position search CAMs 20 require a memory capacity of 512 kbits (=128 kbits×4), and the original search CAM 30 requires a memory capacity of 260.5 kbits (=(64 bytes+9 bits)×512 entries) as described in conjunction with the semiconductor device 1C according to the fourth embodiment. That is, the total memory capacity required to implement the semiconductor device 1D according to the fifth embodiment is 772.5 kbits (=512 kbits+260.5 kbits). It signifies that the required total memory capacity is 18.9% (=772.5 kbits/4096 kbits) of the total memory capacity required to implement a 16-byte shift in the integrated circuit having a built-in CAM according to the related art. In short, the memory capacity can be reduced by approximately 80%.

Additionally, low power consumption can be achieved. Let us assume, for example, that the consumption current required for a search operation of the original search CAM 30 having a memory capacity of 256 kbits is 100 mA, as is the case with the fourth embodiment. In this instance, the consumption current required for a 16-byte shift search is calculated to be 242 mA (=35 mA×4+102 mA) when the match rate (hit rate) in the position search CAM 20A is 100% (worst conditions) and the match rate (hit rate) in the original search CAM 30A is 100% (worst conditions). As a consumption current of 1600 mA (100 mA×16) is required to implement a 16-byte shift search by using sixteen original search CAMs in the integrated circuit having a built-in CAM according to the related art illustrated in FIG. 1, the semiconductor device 1D according to the fifth embodiment is capable of reducing the consumption current by approximately 85% even under the worst conditions.

[H. Sixth Embodiment]

In accordance with the information about a search character string detected in the position search CAM 20, the semiconductor device 1 according to the first embodiment generates shifted search data (SPD) for use in a search in the original search CAM 30. By contrast, a sixth embodiment of the present invention will now be described in relation to a configuration where a search rule stored in the original search CAM 30 is adapted as appropriate.

Figure 16:
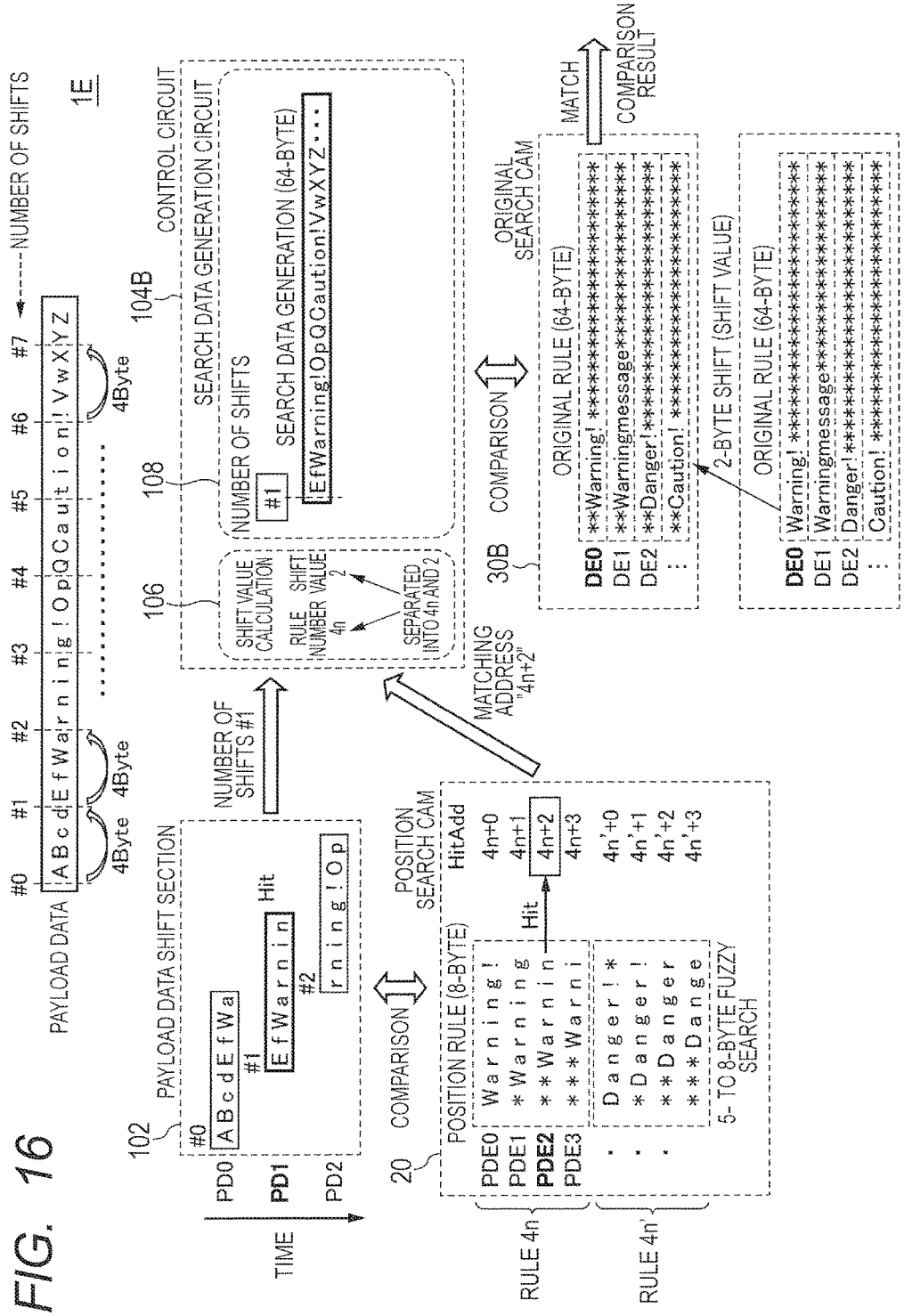
FIG. 16 is a schematic diagram illustrating a search operation that is performed on payload data by using the semiconductor device according to a sixth embodiment of the present invention.

FIG. 16 is a schematic diagram illustrating a search operation that is performed on payload data by using a semiconductor device 1E according to the sixth embodiment. The semiconductor device 1E shown in FIG. 16 differs from the semiconductor device 1 according to the first embodiment in the processes performed by a control circuit 104B (search data generation circuit 108B) and an original search CAM 30B. The other elements and operations are the same as those in the first embodiment and will not be redundantly described in detail.

The search data generation circuit 108B in the control circuit 104B generates search data from payload data in accordance with information about the number of shifts, which is received from the payload data shift section 102. In this instance, the search data generation circuit 108B does not shift the generated search data and inputs the generated search data as is to the original search CAM 30B.

In accordance with a shift value calculated in the control circuit 104B, the original search CAM 30B generates a shifted search rule by shifting a stored search rule (original rule). The original search CAM 30B then compares the search data against the shifted search rule to determine whether they match. Employing the above configuration makes it possible to simplify a search data extraction process performed by the control circuit 104B.

As far as the search data can be compared against the search rule stored in the original search CAM 30 as described above in accordance with the start position of the search character string, implementation may be achieved in any form.

[I. Seventh Embodiment]

Implementation of a search system according to an embodiment of the present invention will now be described.

Figure 17:
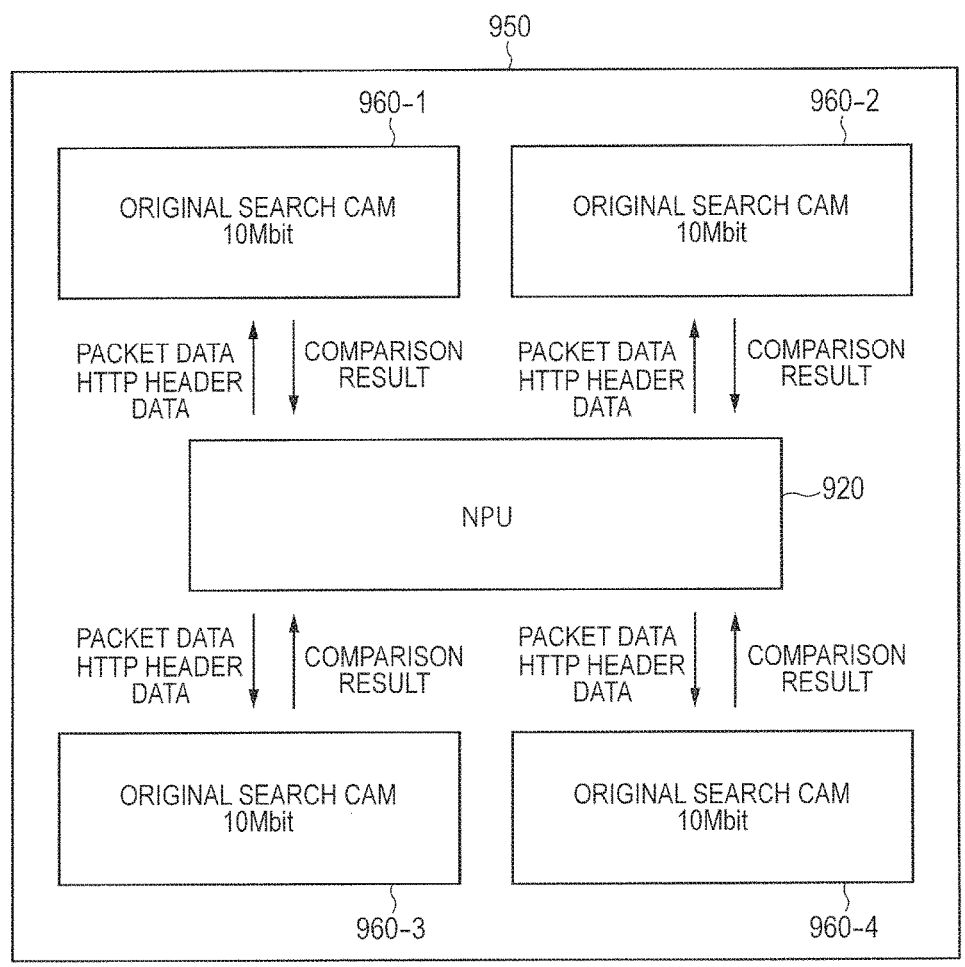
FIG. 17 is a schematic diagram illustrating an exemplary configuration for implementing a 4-byte shift search by using an original search CAM capable of executing a 1-byte shift search.

FIG. 17 is a schematic diagram illustrating an exemplary configuration for implementing a 4-byte shift search by using an original search CAM capable of executing a 1-byte shift search. Referring to FIG. 17, a search system 950 according to the related art is typically applicable to a network search engine or a network security system. Specifically, the search system 950 includes an NPU 920, which is a host controller, and four original search CAMs 960-1 to 960-4. It is assumed that the original search CAMs 960-1 to 960-4 each have a memory capacity of 10 Mbits. The original search CAMs 960-1 to 960-4 are capable of executing a 1-byte shift search. A 4-byte shift search is achieved by allowing the NPU 920 to shift payload data (typically, packet data) targeted for a search, one byte at a time, and inputting the resulting payload data to the original search CAMs 960-1 to 960-4.

As illustrated in FIG. 17, the search system 950 according to the related art requires four original search CAMs 960 having a large capacity (for example, 10 Mbits) in order to achieve a four-fold search throughput. Thus, the footprint for implementing the search system 950 is excessively increased. As a result, it may be difficult in some cases to implement the search system 950.

Figure 18:
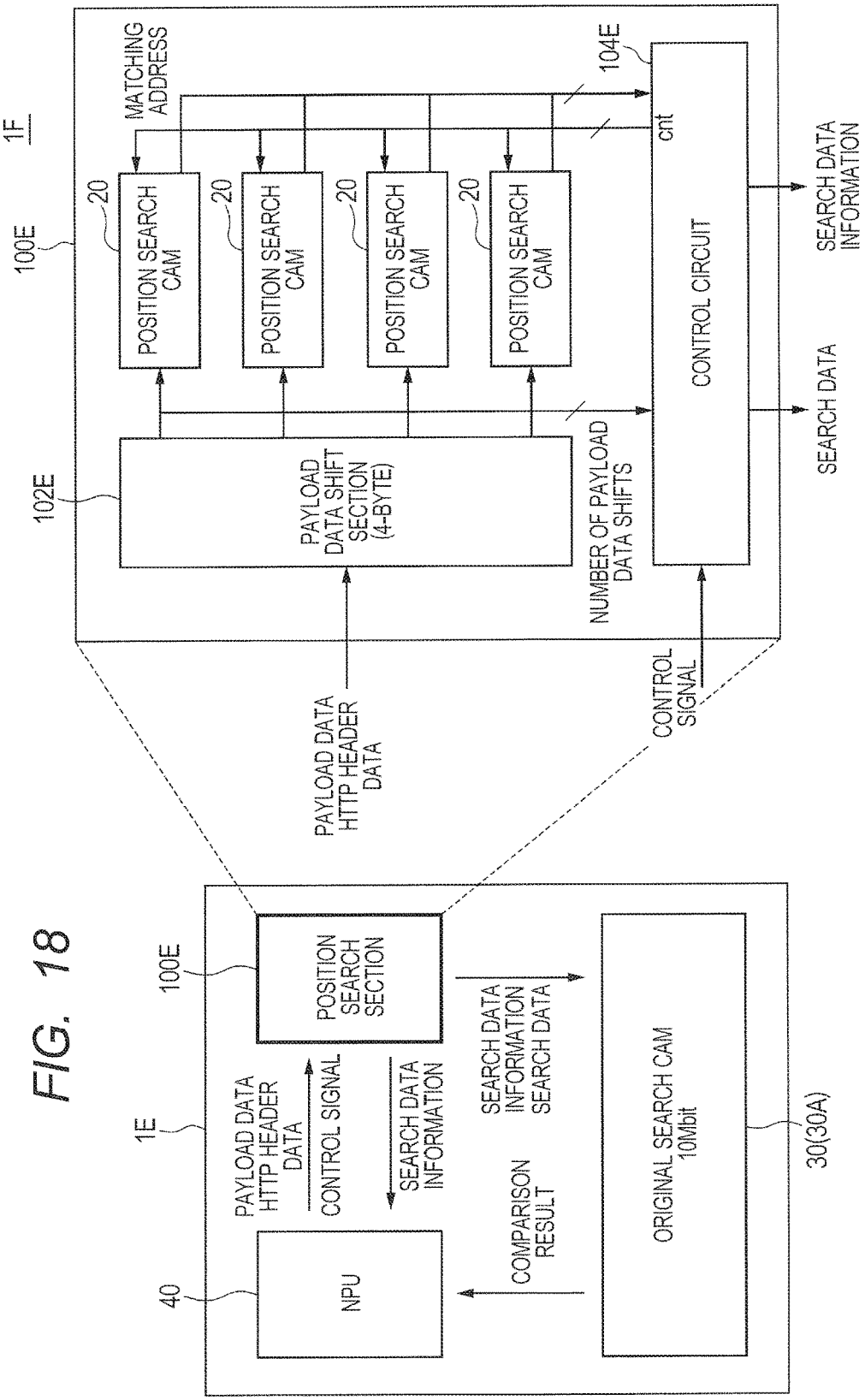
FIG. 18 is a schematic diagram illustrating a configuration of the semiconductor device according to a seventh embodiment of the present invention.

FIG. 18 is a schematic diagram illustrating a configuration of a semiconductor device 1F according to a seventh embodiment of the present invention. The semiconductor device 1F shown in FIG. 18 includes a position search section 100E, an original search CAM 30, and an NPU 40, which is a host controller. These components can be mounted on a single substrate.

The NPU 40 acquires packet data flowing on a network (not shown), extracts payload data and HTTP header data included in the acquired packet data, and outputs the extracted data to the position search section 100E as search target data. The position search section 100E searches the inputted payload data for the start position of a character string that matches a stored search character string (entry value). The position search section 100E outputs search data information (rule number, shift value, etc.) retrieved from the search and generated search data to the original search CAM 30. The original search CAM 30 executes an original search (full-text search) on search data inputted from the position search section 100E and outputs, to the NPU 40, a comparison result derived from the original search.

The position search section 100E includes a payload data shift section 102E, four position search CAMs 20, and a control circuit 104E. The payload data shift section 102E shifts the inputted payload data four bytes at a time and sequentially outputs search payload data PD. The payload data shift section 102E may process only payload data corresponding to an identifier included in the HTTP header data.

The position search section 100E achieves a 4-byte shift search by using four position search CAMs 20. In accordance with search results outputted from the position search CAMs 20, the control circuit 104E acquires the search data information (rule number, shift value, etc.) and generates search data.

Employing the position search CAM 20 having a smaller memory capacity than the original search CAM 30 and capable of rapidly searching for the start position of a search character string as indicated in FIG. 18 makes it possible to achieve low power consumption while reducing the memory capacity required for implementing a 4-byte shift search. Consequently, it is possible to provide a network search engine and a network security system that achieve a search throughput equivalent to or higher than a search throughput provided by a related-art configuration. That is to say, character string extraction, for example, can be achieved as required at the wire speed of a network.

The exemplary configuration illustrated in FIG. 17 includes four original search CAMs 960-1 to 960-4. The semiconductor device 1F according to the seventh embodiment, however, includes four position search CAMs 20 having a smaller footprint than the original search CAMs 960. Therefore, the semiconductor device 1F requires only two components, namely, the position search section 100E and the original search CAM 30, in addition to the NPU 40. As a result, the footprint of the semiconductor device 1F can be reduced.

[J. Eighth Embodiment]

The seventh embodiment has been described in relation to the semiconductor device 1F that is capable of implementing a network search engine or a network security system. An eighth embodiment of the present invention will now be described in relation to a configuration where a recursive search method is used to search HTTP header data for the start position of a predesignated search character string and search data information (rule number, shift value, etc.) retrieved from the search and generated search data are outputted to the original search CAM 30.

Figure 19:
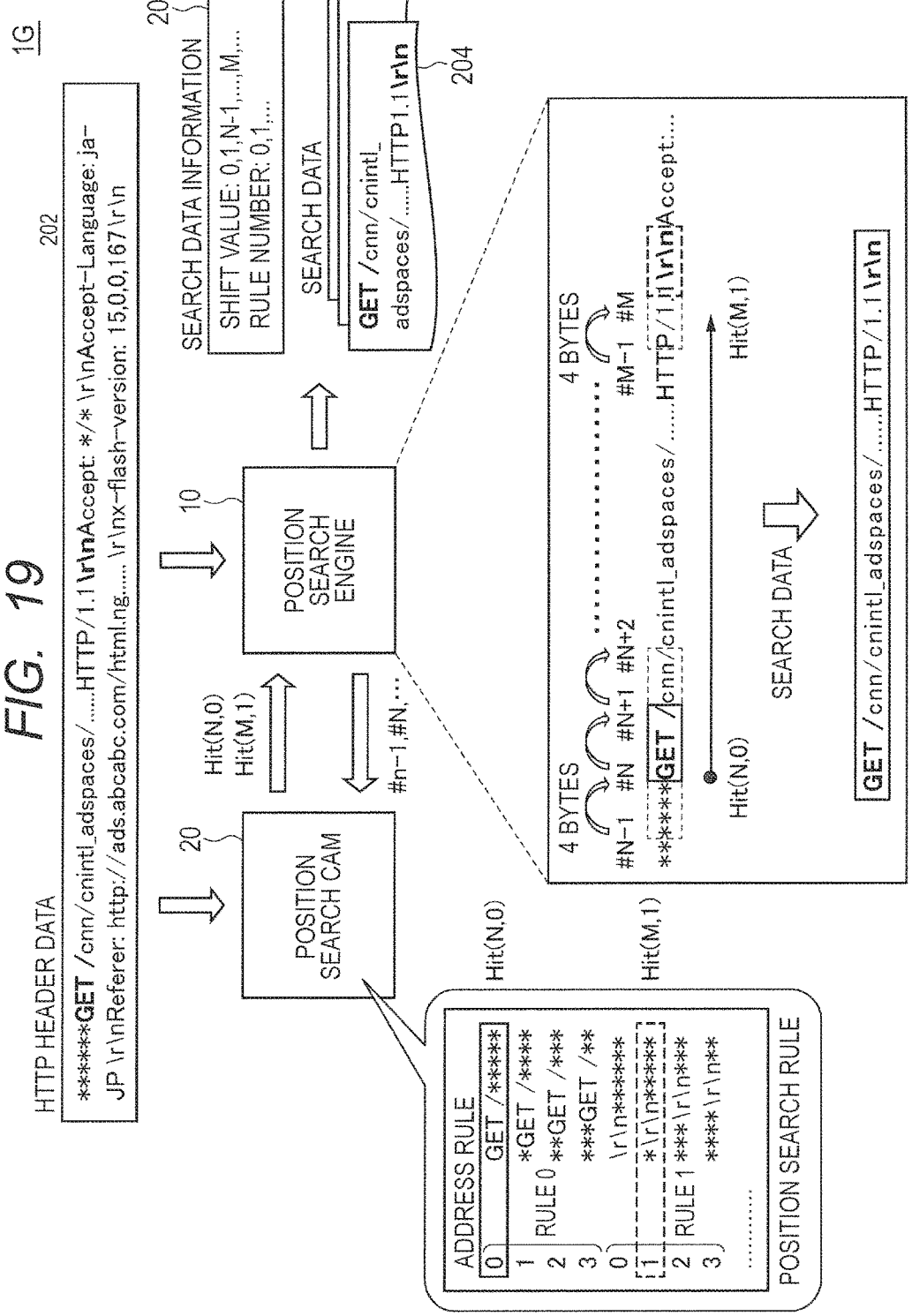
FIG. 19 is a schematic diagram illustrating a configuration of essential parts of the semiconductor device according to an eighth embodiment of the present invention and a search operation performed by the same semiconductor device.

FIG. 19 is a schematic diagram illustrating a configuration of essential parts of a semiconductor device 1G according to the eighth embodiment and a search operation performed by the same semiconductor device 1G. Referring to FIG. 19, the semiconductor device 1G according to the eighth embodiment includes, as main components, a position search CAM

20 and a position search engine 10. Typically, the position search engine 10 may be implemented as a logic circuit. The position search CAM 20 preferably uses a TCAM (ternary CAM) array capable of being set so that the result of a comparison is determined to be a match irrespective of the value of a comparison target (don't care).

In the semiconductor device 1G according to the eighth embodiment, a specific header portion and footer portion included in the HTTP header data are designated as a keyword (search character string) to be extracted. For example, "GET/" (rule 0), which is the first address rule, is registered as the specific header portion, and "\r\n" (rule 1), which is the second address rule, is registered as the specific footer portion. The start portion and end portion of the character string to be extracted are registered as a search rule.

In the semiconductor device 1G, the position search CAM 20 stores four entries of each address rule, which are obtained by performing a 1-byte shift at a time, in order to execute a byte-shift search.

As is the case with the aforementioned payload data shift section 102, the position search engine 10 shifts the HTTP header data four bytes at a time and inputs the resulting HTTP head data to the position search CAM 20. The position search CAM 20 executes a position search (partial search) on the inputted HTTP header data and outputs the result of the search to the position search engine 10. In accordance with the search result from the position search CAM 20, the position search engine 10 extracts the keyword (search character string) from the HTTP header data. The position search engine 10 outputs start position information about the search character string in the HTTP header data (the number of shifts) and search data information about the search character string detected in the position search CAM 20 (rule number, shift value, etc.) 202. Further, the position search engine 10 generates search data 204 including a matching search character string and outputs the generated search data 204 to the original search CAM (not shown).

A search operation performed by the position search engine 10 will now be described in detail. First of all, the position search engine 10 shifts the HTTP header data four bytes at a time, such as search header data #N-1 "**GET/c", search header data #N "GET/cnn/c", and so on, and inputs the resulting 10-byte data to the position search CAM 20. The position search CAM 20** compares each of the inputted search header data against a stored search rule (address rule).

In the HTTP header data shown in FIG. 19, search header data #N "GET/cnn/c" matches address 0 "GET/*****" of address rule 0, and search header data #M "1\r\nAccep" matches address 1 "*\r\n***" of address rule 1. When the inputted HTTP header data matches a certain entry, the position search CAM 20 outputs search data information about the matching search character string (start position information (the number of shifts), rule number, etc.) to the position search engine 10**.

The position search engine 10 executes a recursive search by using search footer data corresponding to the matching search header data. In the example of FIG. 19, the start position information "#N" about the matching search character string and the rule number "0" are outputted as an address in the form, for instance, of Hit (N,0).

In accordance, for example, with the search data information from the position search CAM 20, the position search engine 10 identifies the positions of the first and last characters of the keyword to be extracted from the HTTP header data. In the example of FIG. 19, a portion of the HTTP header data that is between #N "GET/" and #M "\r\n" is extracted as the keyword "GET/cnn/cnintl_ad-spaces/ . . . . . .HTTP/1.1\r\n".

The original search CAM (not shown) executes an original search (full-text search) on the extracted keyword.

By using the position search CAM 20, the semiconductor device 1G according to the eighth embodiment is capable of rapidly searching for a keyword in HTTP header data while suppressing an increase in the overall memory capacity of a search system. Therefore, keyword extraction (character string extraction) can be achieved at the wire speed of a network. The position search CAM 20A having the above-described pre-search function may be used as the position search CAM 20.

When a table search method based on the position search CAM 20 is combined with a recursive search method based on the position search engine 10, a keyword (character string) can be rapidly extracted from HTTP header data. As the semiconductor device 1G according to the eighth embodiment is capable of acquiring the start position of a specific search character string, the beginning of the search character string can be determined. Consequently, the search character string can be identified from an inputted character string by using a common table search method.

[K. Ninth Embodiment]

The following describes an exemplary configuration for addressing a problem caused by a multi-match that may occur when a position search, that is, a partial search, is employed.

The "multi-match" described in this document is a phenomenon in which the results of searches executed on the same search payload data by using two or more search rules (position rules) stored in the position search CAM 20 are determined to be a match (hit). The multi-match can be avoided by registering an appropriate search character string. However, the following describes a configuration capable of performing a robust search operation no matter what search character string is used.

Figure 20:
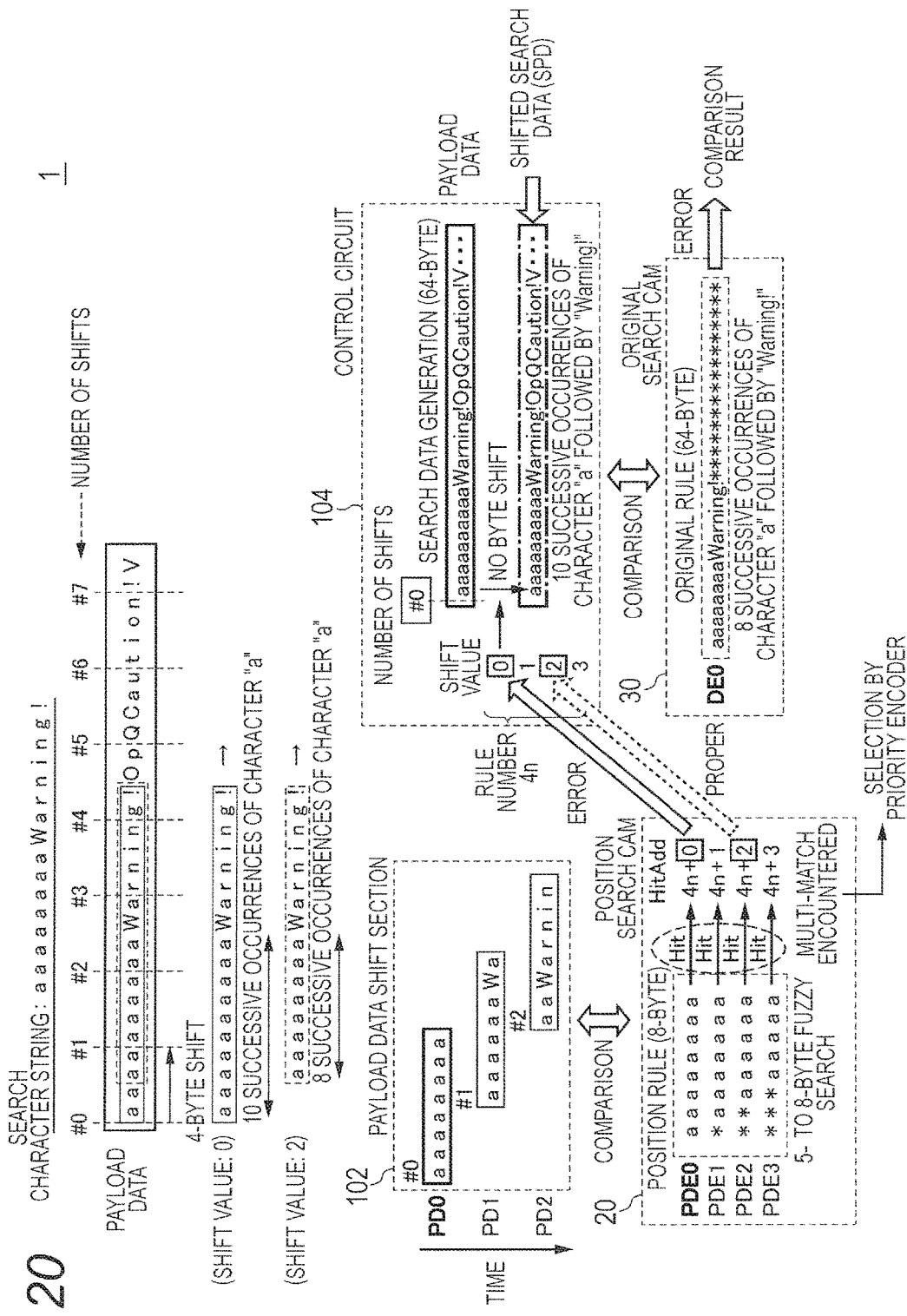
FIG. 20 is a diagram illustrating a multi-match that may occur in the semiconductor device according to the first embodiment shown in FIG. 5.

FIG. 20 is a diagram illustrating a multi-match that may occur in the semiconductor device 1 according to the first embodiment shown in FIG. 5. Referring to FIG. 20, let us assume that an employed search character string begins with the repetition of the same character, such as in "aaaaaaaaWarning!" (eight successive occurrences of the character "a" followed by "Warning!"). When such a search character string beginning with the repetition of the same character is registered, a multi-match may occur in a position search that is executed by using the position search CAM 20.

In general, a priority encoder (PE) (not shown) is provided for the position search CAM 20. When a multi-match occurs, that is, when a plurality of matching addresses (HitAdds) are simultaneously outputted, the priority encoder selects and outputs the highest priority matching address. However, the highest priority matching address is not always a proper matching address. A proper matching character string may be missed by an original search (full-text search) in the original search CAM 30. This problem is described in detail below.

In the example of FIG. 20, the payload data shift section 102 shifts search payload data four bytes at a time and inputs the resulting 8-byte search payload data PD1 "aaaaaaWa", 8-byte search payload data PD2 "aaWanin", and so on to the position search CAM 20.

The position search CAM 20 stores beforehand an 8-byte search rule (position rule) by performing a 1-byte shift at a time, such as the entry PDE0 "aaaaaaaa", the entry PDE1 "*aaaaaaa", the entry PDE2 "aaaaaa", and the entry PDE3 "*aaaaa".

In the position search CAM 20, the entry PDE0 "aaaaaaaa", the entry PDE1 "*aaaaaaa", the entry PDE2 "aaaaaa", and the entry PDE3 "*aaaaa" are all determined to be a match (hit) with respect to the first search payload data PD0 "aaaaaaaa". That is, a multi-match occurs on all the four entries.

When the above multi-match occurs, the priority encoder selects and outputs only the highest priority matching address. In the example of FIG. 20, the priority encoder outputs only a matching address (HitAdd) "4n+0" of the entry PDE0, which is the lowest among the stored addresses. The control circuit 104 separates the matching address "4n+0" into the rule number "4n" and the shift value (offset information) "0". From the number of payload data shifts "0" in the payload data shift section 102 and the shift value "0", the control circuit 104 calculates the start position information "0" (=4×0+0) about a character string in the payload data. From the calculated start position information, the control circuit 104 generates shifted search data (SPD) that is to be subjected to a full-text search in the original search section 200. In this instance, the shifted search data (SPD) is "aaaaaaaaaaWarning!" (ten successive occurrences of the character "a" followed by "Warning!").

The original search CAM 30 stores a required number of bytes of a search character string from its beginning. In the example of FIG. 20, the original search CAM 30 is capable of storing a character string of up to 64 characters in length per entry (one character is equal to one byte). If, for example, the search character string is "aaaaaaaaWarning!" (eight successive occurrences of the character "a"), "aaaaaaaaWarning!******" (eight successive occurrences of the character "a") is registered as the entry DE0 in the original search CAM 30**. Here, bytes other than the leading 16 bytes of the character string may be formed of any character. Therefore, "* (asterisk)" (don't care) is designated as indicated above.

The original search CAM 30 compares the shifted search data SPD "aaaaaaaaaaWarning! . . . " (ten successive occurrences of the character "a"), which is generated by the control circuit 104, against the stored search rule. In the example of FIG. 20, the result of the comparison is determined to be a mismatch (miss) because the shifted search data SPD "aaaaaaaaaaWarning! . . . " (ten successive occurrences of the character "a") does not match the entry DE0 "aaaaaaaaWarning!********" (eight successive occurrences of the character "a").

That is to say, in the search operation depicted in FIG. 20, the result is determined to be a mismatch (miss) in the original search CAM 30 because the priority encoder outputs "4n+0" as a matching address. If, by contrast, the priority encoder outputs "4n+2" as the matching address, the control circuit 104 generates the shifted search data (SPD) by using the shift value "2". In this instance, "aaaaaaaaWarning!******" (eight successive occurrences of the character "a") is inputted to the position search CAM 20 so that the result of comparison in the position search CAM 20** is determined to be a match (hit).

That is, in the example of FIG. 20, the result is determined to be a mismatch (miss) because the control circuit 104 generates the shifted search data SPD in accordance with the shift value=0. However, if the shifted search data SPD is generated on the assumption that the shift value=2, the result can be determined to be a match (hit).

As described above, when a multi-match occurs, the priority encoder does not output a proper matching address, but outputs a different matching address. Therefore, the result to be obtained from search payload data may be erroneously determined to be a mismatch (miss) although it should normally be determined to be a match (hit).

As such being the case, a ninth embodiment of the present invention will now be described in relation to a configuration where a comparison result can be outputted without making an erroneous determination even if the above-described multi-match has occurred.

FIG. 21 is a schematic diagram illustrating a configuration of essential parts of a semiconductor device 1H device according to the ninth embodiment and a search operation performed by the same semiconductor device. Referring to FIG. 21, the semiconductor device 1H includes four position search CAMs 20_0-20_3 to which the same search payload data is parallelly inputted. As a measure against a multi-match, the four position search CAMs 20_0-20_3 are provided with priority encoders (PEs) 22_0-22_3, respectively.

The semiconductor device 1H according to the ninth embodiment is configured so that a plurality of entries obtained by giving different offsets to the same search character string (a part of it) are dispersively stored in the position search CAMs 20_0-20_3. More specifically, entries obtained by subjecting the same search rule (position rule) to a 1-byte shift at a time are stored in the position search CAMs 20_0-20_3. In the semiconductor device 1 according to the first embodiment, one position search CAM 20 stores a search rule for four entries. Meanwhile, in the semiconductor device 1H according to the ninth embodiment, one position search CAM 20 stores one entry that is obtained by shifting the same search rule one byte at a time. The entries are obtained by shifting an 8-byte search rule (position rule) one byte at a time. For example, the entry PDE0 "aaaaaaaa" is stored in the position search CAM 20_0, the entry PDE1 "*aaaaaaa" is stored in the position search CAM 20_1, the entry PDE2 "aaaaaa" is stored in the position search CAM 20_2, and the entry PDE3 "*aaaaa" is stored in the position search CAM 20_3.

The same search payload data (corresponding to address <87:24> in FIG. 21) is simultaneously inputted to the four position search CAMs 20_0-20_3. The position search CAMs 20_0-20_3 each compare the stored entries against the inputted search payload data. When a match (hit) occurs, the position search CAMs 20_0-20_3 output a matching address (HitAdd) to the associated priority encoders 22.

In the example of FIG. 21, it is assumed that "aaaaaaaaWarning!" (eight successive occurrences of the character "a" followed by "Warning!") is designated as a search character string, as is the case with FIG. 20. The following describes a case where "aaaaaaaa" is inputted in the above state as the search payload data.

As the stored entries are determined to be a match (hit) in all the position search CAMs 20_0-20_3, the position search CAMs 20_0-20_3 output "4n+0", "4n+1", "4n+2", and "4n+3", respectively, as matching addresses (HitAdd0-HitAdd3)

The control circuit 104 (not shown) in the semiconductor device 1H according to the ninth embodiment extracts search data from an input data string in accordance with position information about a portion that matches a search character string (a part of it) outputted from each of the position search CAMs 20_0-20_3. That is, the control circuit 104 generates the search data in accordance with an outputted matching address. The original search CAM 30 then executes an original search (full-text search) on each of the generated search data. As a result, the search data generated based on "4n+2", which is a matching address (HitAdd2) outputted from the position search CAM 20_2, matches a search character string stored in the original search CAM 30.

In the semiconductor device 1H according to the ninth embodiment, the priority encoders 22_0-22_3 do not evaluate priority among matching addresses based on a plurality of entries generated from the same search rule, but evaluates priority among entries generated respectively from different search rules. This makes it possible to avoid a situation where a matching address to be properly outputted is missed as indicated in FIG. 20.

As described above, when the same search payload data and the search rules are parallelly compared by using different position search CAMs 20, it is possible to avoid a situation where the failure to output a matching address occurs due to the use of a single position search CAM 20.

[L. Tenth Embodiment]

If a multi-match occurs in the semiconductor device 1H according to the ninth embodiment, the search character string is not missed; however, the false positive rate of a position search (fuzzy search) in the position search CAM 20 is increased to a certain degree. The false positive rate is the probability with which the result of a position search is determined to be a match although the result of a final original search is determined to be a mismatch. If an overhead resulting from such an increase in the false positive rate is a problem, it is preferred that a semiconductor device 1I according to a tenth embodiment of the present invention be employed. A configuration of the semiconductor device 1I according to the tenth embodiment is described below.

Figures 22A, 22B:
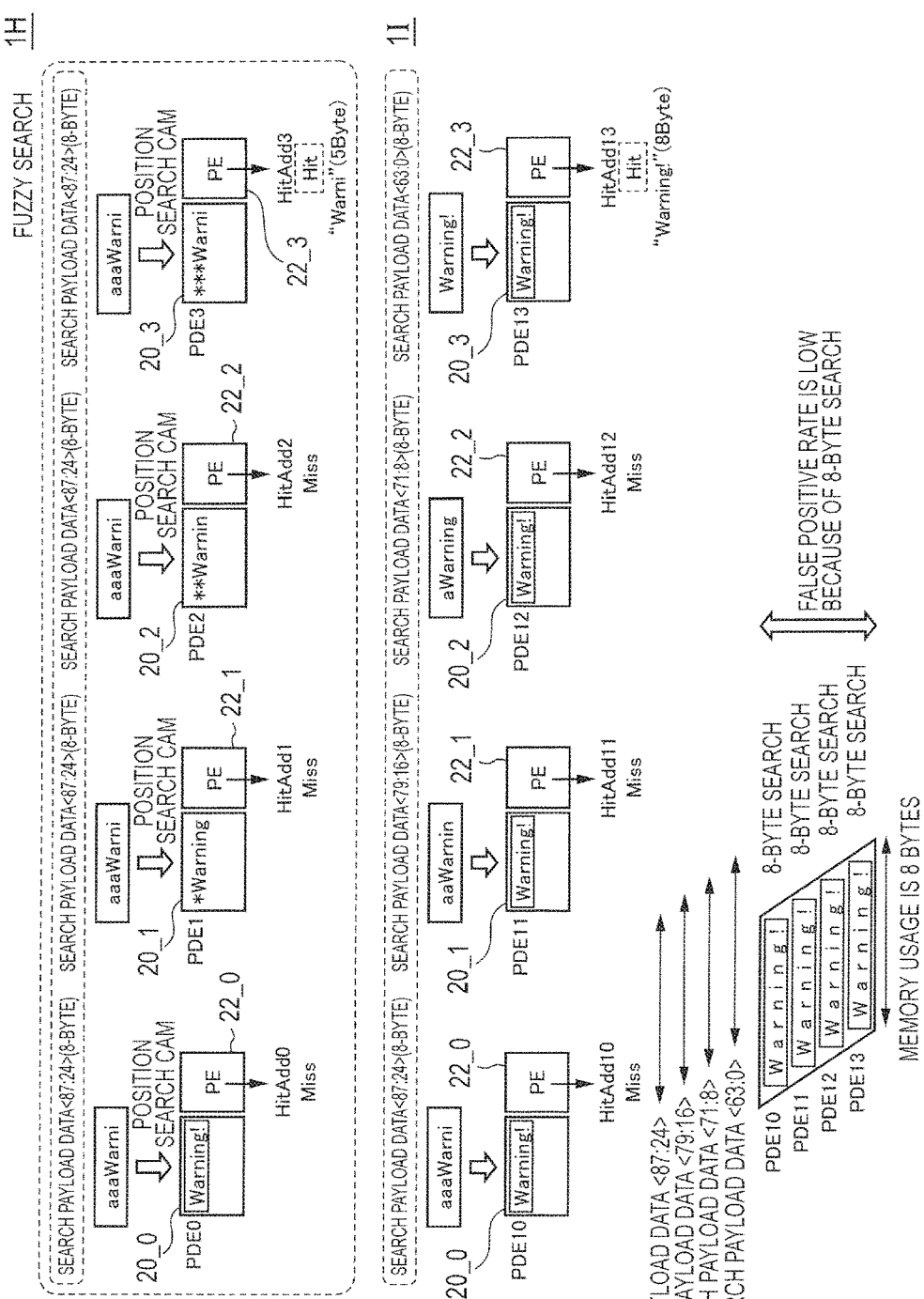
FIGS. 22A and 22B are schematic diagrams prepared to illustrate a configuration of essential parts of the semiconductor device according to a tenth embodiment of the present invention and a search operation performed by the same semiconductor device.

FIGS. 22A and 22B are schematic diagrams prepared to illustrate a configuration of essential parts of the semiconductor device 1I according to the tenth embodiment and a search operation performed by the same semiconductor device 1I. FIG. 22A illustrates, as a comparison target, the configuration of essential parts of the semiconductor device 1H according to the ninth embodiment and the search operation performed by the same semiconductor device 1H. FIG. 22B illustrates the configuration of essential parts of the semiconductor device 1I according to the tenth embodiment and the search operation performed by the same semiconductor device 1I.

A comparison between FIG. 22A and FIG. 22B indicates that the configuration of essential parts of the semiconductor device 1I according to the tenth embodiment is similar to the configuration of essential parts of the semiconductor device 1H according to the ninth embodiment. However, the configuration of the tenth embodiment differs from the configuration of the ninth embodiment in the entries stored in the position search CAMs 20_0-20_3 and in the method of search payload data input to the position search CAMs 20_0-20_3.

Referring to FIG. 22A, an increase in the false positive rate that may occur in the semiconductor device 1H according to the ninth embodiment will be first described. FIGS. 22A and 22B illustrate a search operation that is performed when "Warning!" is used as the search character string.

In the position search CAMs 20_0-20_3 of the semiconductor device 1H shown in FIG. 22A, entries obtained by shifting the search character string "Warning!" one byte at a time are stored. More specifically, the entry PDE0 "Warning!", the entry PDE1 "*Warning", the entry PDE2 "Warnin", and entry PDE3 "*Warni" are stored in the position search CAMs 20_0-20_3, respectively.

Let us assume that the same search payload data "aaaWarni" is inputted to the position search CAMs 20_0-20_3 in which the above-described search rule is stored. A fuzzy search is executed in the position search CAMs 20_0-20_3. In the fuzzy search, the inputted search payload data matches the entry PDE3 "***Warni", which is stored in the position search CAM 20_3. In the fuzzy search, however, a character string in the entries stored in the position search CAMs 20 that perfectly matches the search payload data is formed of the five characters "Warni" (five bytes). Characters following "Warni" are not determined. Therefore, if, for example, the search data generated by the control circuit is "WarniNG! . . . ", the search data does not match the search character string "Warning!" in the original search CAM 30. As described above, when the fuzzy search is executed as described in conjunction with the ninth embodiment, the result produced in the original search CAM 30 may riot always be determined to be a match (hit) even if the result produced in the position search CAMs 20 is determined to be a match (hit)

Referring to FIG. 22B, the position search CAMs 20_0-20_3 of the semiconductor device 1I according to the tenth embodiment store the same search character string "Warning!". The search payload data is then shifted one byte at a time and inputted to the position search CAMs 20_0-20_3. Indications such as "<87:24>" in FIGS. 22A and 22B represent the start and end positions (byte positions) of a character string that is included in the inputted payload data and is to be extracted as the search payload data.

The position search CAMs 20_0-20_3 commonly include the same search character string (a part of it), and data beginning from different positions in the payload data are inputted to the position search CAMs 20_0-20_3 as search targets. More specifically, in the semiconductor device 1I according to the tenth embodiment, the 8-byte search character string "Warning!" is stored in all the position search CAMs 20_0-20_3 by using the memory region for "* (asterisk)" (don't care), which is stored in the position search CAMs 20_0-20_3 of the semiconductor device 1H according to the ninth embodiment shown in FIG. 22A.

The search payload data to be inputted to the position search CAMs 20_0-20_3 are shifted one byte at a time. More specifically, "aaaWarni" is inputted to the position search CAM 20_0, "aaWarnin" is inputted to the position search CAM 20_1, "aWarning" is inputted to the position search CAM 20_2, and "Warning!" is inputted to the position search CAM 20_3. The position search CAMs 20_0-20_3 each compare the inputted search payload data against stored entries. When the result of comparison is determined to be a match (hit), the position search CAMs 20_0-20_3 output a matching address (HitAdd).

In the example of FIG. 22B, the inputted search payload data matches a stored entry PDE13 in the Position search CAM 20_3. In contrast to the fuzzy search illustrated in FIG. 22A, the false positive rate can be decreased because the whole registered entry "Warning!" matches the search payload data. As described above, the false positive rate can be decreased by outputting a match (hit) signal only when "* (asterisk)" (don't care) is eliminated from the search rule (position rule) to be registered in a plurality of position search CAMs 20 and all the character strings of registered entries match the inputted search payload data. Further, decreasing the false positive rate will decrease the frequency with which an unnecessary original search (full-text search) is executed in the original search CAM 30. This makes it possible to reduce the overall power consumption of circuitry.

[L. Advantages]

As described above, the embodiments of the present invention make it possible to implement a circuit configuration that is capable of executing a keyword search at an increased speed while suppressing an increase in the memory capacity of a content-addressable memory.

While the embodiments of the present invention contemplated by its inventors have been described in detail, the present invention is not limited to the embodiments described above. It is to be understood that various modifications may be made without departing from the spirit of the present invention.

What is claimed is:

1. A semiconductor device that searches keyword in an input data string, the semiconductor device comprising:
    a data shift section that receives the input data string, and generates a first substring and a second substring of the input data string, a beginning of the first string being shifted a first number of characters from a beginning of the input data string, a beginning of the second substring being shifted a second number of characters from the beginning of the first substring;
    a first content-addressable memory that stores a partial keyword of the keyword, the partial keyword being stored as a first partial keyword entry and a second partial keyword entry, wherein the first partial keyword entry including a predetermined number of characters, the predetermined number of characters of the first partial keyword entry comprising a first number of offset characters and a first number of keyword characters, and wherein the second keyword entry including the predetermined number of characters, the predetermined number of characters in the second keyword entry comprising a second number of offset characters and a second number of key word characters, the first number of offset characters being different from the second number of offset characters;
    a second content-addressable memory that stores the entirety of the keyword; and
    a control circuit that is coupled to the data shift section, to the first content-addressable memory, and to the second content-addressable memory, the control circuit configured to:
        compare the first sub string of the data shift section to the first partial keyword entry and the second partial keyword entry of the first content-addressable memory;
        when a part of the keyword represented by the first number of keyword characters is determined to be included in the first substring based on the comparison, extract 1) the first number of characters shifted that is associated with the first substring from the data shift section and 2) position information associated with the first partial keyword entry from the first content-addressable memory, the position information including a first offset value associated with the first number of offset characters;
        generate search data based on the first number of characters shifted and the position information; and
        when the search data is determined to match the keyword in the second content-addressable memory, allow the second content-addressable memory to output an address associated with the entirety of the keyword.

2. The semiconductor device according to claim 1, wherein the first content-addressable memory has a smaller memory capacity than the second content-addressable memory.

3. The semiconductor device according to claim 1, wherein the second content-addressable memory performs a search operation when the part of the keyword represented by the first number of keyword characters is determined to be included in the first substring based on the comparison.

4. The semiconductor device according to claim 1, wherein the position information includes information identifying the keyword corresponding to the first partial keyword entry and the second partial keyword entry in the first content-addressable memory.

5. The semiconductor device according to claim 4, wherein the second content-addressable memory further stores a second keyword, and selects the keyword or the second keyword in accordance with the information identifying the keyword that is included in the position information.

6. The semiconductor device according to claim 1, comprising a plurality of units of the first content-addressable memory, wherein the plurality of units of the first content-addressable memory commonly includes the same partial keyword, wherein a first unit of the plurality of units of the first content-addressable memory stores the first partial keyword entry, and a second unit of the plurality of units of the first content- addressable memory stores the second partial keyword entry, and wherein the first number of offset characters of the first partial keyword entry differ from the second number of offset characters of the second partial keyword entry.

7. The semiconductor device according to claim 1, wherein the second content-addressable memory shifts the keyword stored in the second content- addressable memory in accordance with the position information, and compares the shifted keyword against the search data.

8. The semiconductor device according to claim 1, wherein the keyword is a character string, and wherein the first number of characters associated with the first substring and the second number of characters associated with the second substring corresponds to an integer multiple of a number of data required for defining one character of the character string of the keyword.

9. The semiconductor device according to claim 1, wherein comparing the first substring of the data shift section to the first partial keyword entry and the second partial keyword entry of the first content-addressable memory comprises:
    determining whether a first portion of the first substring matches the part of the keyword represented by the first number of keyword characters; and
    when the first portion of the first substring is determined to match the part of the keyword represented by the first number of keyword characters, determining whether a second portion of the first substring, which is different from the first portion of the first substring, matches the first number of offset characters of the first partial keyword entry.

10. The semiconductor device according to claim 1, comprising a plurality of units of the first content-addressable memory, wherein the units of the first content-addressable memory dispersively store the same partial keyword, wherein a first unit of the plurality of units of the first content-addressable memory stores the first partial keyword entry, and a second unit of the plurality of units of the first content-addressable memory stores the second partial keyword entry, and wherein the control circuit generates the search data in accordance with position information from each of the units of the first content-addressable memory.

11. The semiconductor device according to claim 1, comprising a plurality of units of the first content-addressable memory, wherein the units of the first content-addressable memory commonly include the same partial keyword, and wherein the first substring is compared to the first partial keyword entry stored in a first unit of the plurality of units of the first content-addressable memory, and the second substring is compared to the second partial keyword entry stored in a second unit of the plurality of units of the first content-addressable memory.

12. An information processing system that searches an input data string for a keyword, the information processing system comprising:
  a data shift section that receives the input data string, and generates a sub string of the input data string, a beginning of the substring being shifted a number of characters from a beginning of the input data string;
  a first content-addressable memory that stores a partial keyword entry including a number of offset characters and a number of keyword characters associated with the keyword the keyword;
  a second content-addressable memory that stores the entirety of the keyword; and
  a control circuit that is coupled to the data shift section, to the first content-addressable memory, and to the second content-addressable memory,
  wherein, when part of the keyword represented by the number of keyword characters is determined to be included in the substring based on comparing the substring and the partial keyword entry, the control circuit extracts 1) the number of characters shifted that is associated with the substring from the data shift section and 2) position information associated with the partial keyword entry from the first content-addressable memory, the position information includes a offset value associated with the number of offset characters,
  wherein the control circuits generates search data in accordance with the number of characters shifted and the position information and inputs the search data to the second content-addressable memory.

13. The information processing system according to claim 12, wherein the first content-addressable memory stores a first partial keyword and a second partial keyword, the first partial keyword indicating the beginning of a character string to be extracted from the input data string, the second partial keyword indicating the end of the character string to be extracted from the input data string, and wherein, when a portion matching the first partial keyword is detected in the input data string by a search in the first content-addressable memory, the control circuit causes the first content-addressable memory to search the input data string for a portion matching the associated second partial keyword.

14. The information processing system according to claim 12, wherein the input data string is packet data propagating through a network, and wherein the keyword is a user-designated character string.

15. The information processing system according to claim 12, comprising: a plurality of units of the first content-addressable memory.

16. The information processing system according to claim 12, comprising a host control section that receives the keyword inputted from the outside and outputs a search result obtained from the second content-addressable memory to the outside.

* * * * *